United States Patent [19]
Melgaard et al.

[11] Patent Number: 5,431,491
[45] Date of Patent: Jul. 11, 1995

[54] INSERTION AND EJECTION APPARATUS FOR ENVIRONMENTAL TEST CHAMBERS

[75] Inventors: Hans L. Melgaard, North Oaks; Louis A. Larson, Golden Valley; Wendell Schafer, Minneapolis, all of Minn.

[73] Assignee: Despatch Industries, Minneapolis, Minn.

[21] Appl. No.: 135,147

[22] Filed: Oct. 12, 1993

[51] Int. Cl.⁶ .............................................. A47B 81/00
[52] U.S. Cl. ............................... 312/232.1; 312/293.1
[58] Field of Search ....................... 312/35, 306, 223.1, 312/223.6, 304, 294, 293.1

[56] References Cited

U.S. PATENT DOCUMENTS

| | | | |
|---|---|---|---|
| 3,259,443 | 7/1966 | Lavigne et al. | 312/223.1 |
| 3,339,993 | 9/1967 | Stoddard | 312/223.1 |
| 5,340,340 | 8/1994 | Hastings et al. | 312/223.1 |

FOREIGN PATENT DOCUMENTS 0640115 11/1963 France ............................. 312/223.1

Primary Examiner—Kenneth J. Dorner
Assistant Examiner—Gerald A. Anderson
Attorney, Agent, or Firm—Fredrikson & Byron

[57] ABSTRACT

A method and apparatus for automatically inserting and ejecting electrical connectors of electronic component test trays from electrical connectors in a panel of an environmental test chamber, e.g. an oven, at the beginning and end of a test period to facilitate loading and unloading the test trays. The electronic components are inserted into test trays so that electrical connections are made with test tray conductors which terminate at a test tray connector. The trays are loaded into the oven in an insertion cycle by manually sliding them onto lateral tray supports with the tray connector ends aligned with mating electrical connectors in the panel of the test oven. The insertion cycle of a track guided, carriage mounted, inserter/ejector mechanism is commenced wherein the mechanism is advanced from tray to tray to sequentially insert the tray connectors into the panel mounted connectors until all trays are inserted. The oven door is closed and the test is conducted. Upon completion of the test, the door is opened and the ejection cycle of the mechanism is initiated to sequentially eject the tray connectors from the panel mounted connectors until all trays are ejected. During insertion and ejection of each tray, the mechanism rotates one or more pivot arms about pivots to apply their free ends against the trays to move the trays on the lateral tray supports a constant distance to ensure reliable connection or removal of the tray from the panel mounted connectors. As the mechanism carriage traverses the ends of the trays a tray position trip sensor detects any out of position trays. The mechanism decreases operator fatigue and errors due to improperly seated connectors.

17 Claims, 13 Drawing Sheets

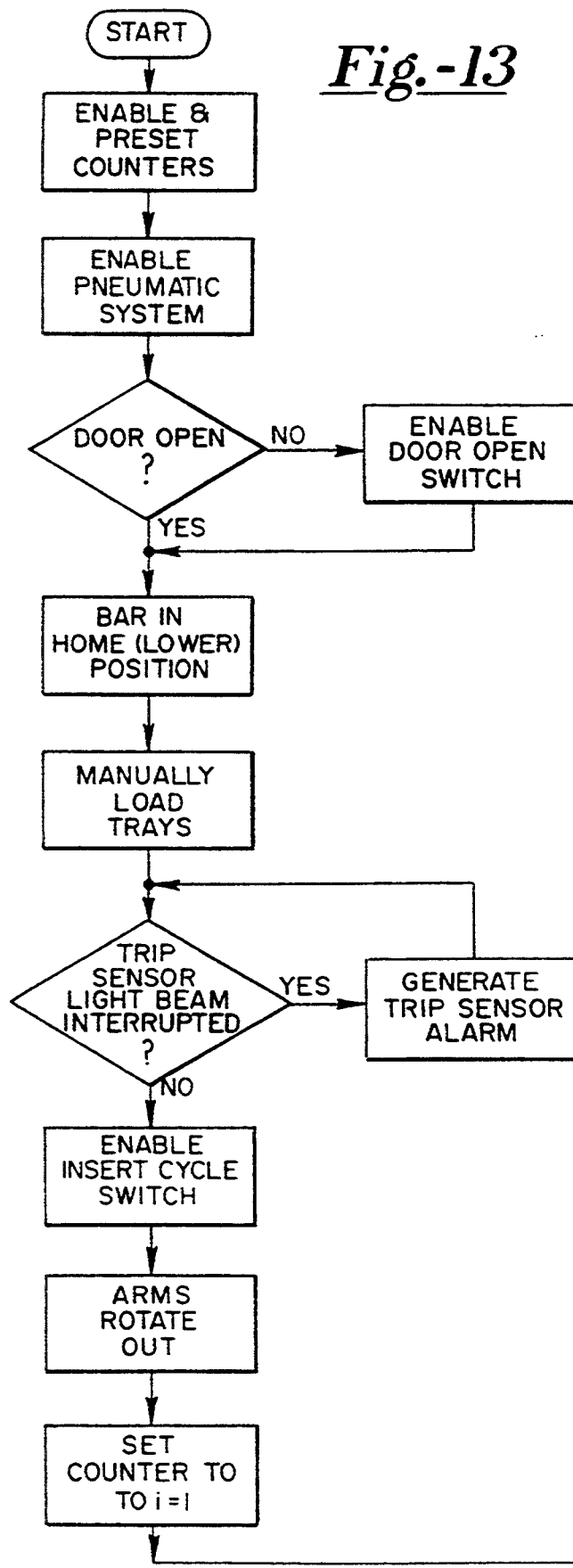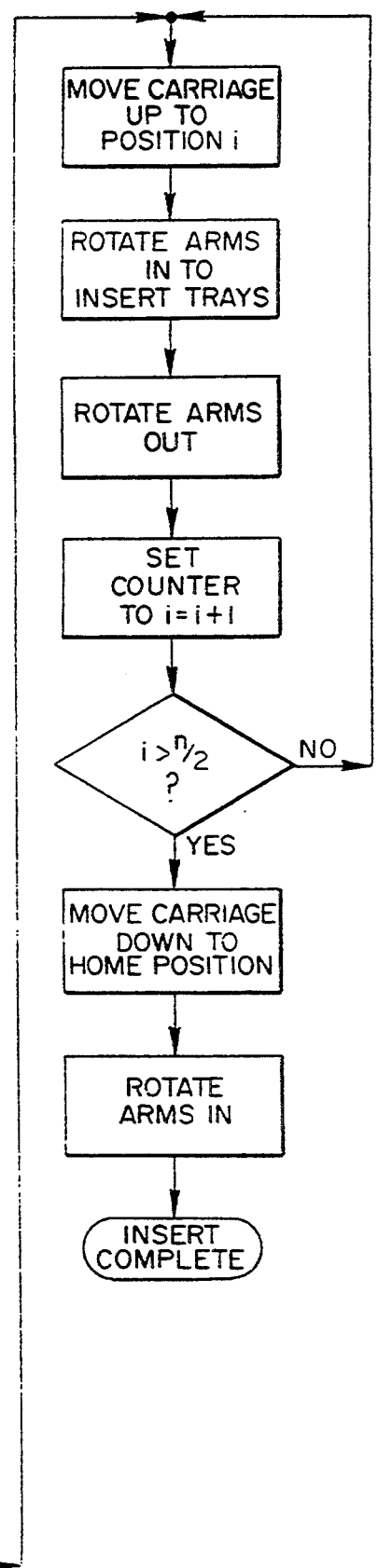
Fig.-13

INSERTION AND EJECTION APPARATUS FOR ENVIRONMENTAL TEST CHAMBERS

BACKGROUND OF THE INVENTION

1. Field of the Invention

The present invention relates to environmental test chambers, e.g. laboratory ovens, for subjecting electronic components to environmental extremes while the components are electrically energized and operating, and particularly to a method and apparatus for facilitating the insertion and ejection of the component trays in the connection and disconnection of component tray electrical connections to mating chamber wall mounted electrical connectors prior to commencement of and following completion of the environmental test of the components.

2. Description of the Prior Art

The design and use of environmental test chambers in which the operation of electrically energized components is tested is well known in industry. Thermal testing or "burn-in" of high reliability integrated circuits for military, aerospace, medical device and other high reliability applications has become institutionalized in the sense that military and industrial specifications for such components require that they survived rigorous thermal and, for certain applications, other environmental testing conditions. Consequently, thermal ovens and environmental test chambers are often employed in quality control and in receiving and inspection operations in manufacturing facilities and operations and they are also employed in research and development laboratories for the testing of new integrated circuit designs. In addition, components other than integrated circuits are often subjected to such testing for the same reasons.

A wide variety of bench top and cabinet environmental chambers and ovens have been developed and are marketed for such uses. Particular designs of "burn-in" ovens which have been developed and are marketed are large enough to simultaneously test manufacturing lots of micro-electronic integrated circuit (IC) devices. These devices are mounted into removable test trays which in turn are slidably suspended in spaced-apart lateral tray supports mounted inside the oven chamber, so that the trays are separated from one another to allow for even temperature distribution by air circulating within the chamber. The test trays are relatively flat and thin and can contain a number (such as 64 or 128) IC pin receptacles, into each of which an IC is inserted. The trays include printed circuit conductors leading from the receptacle terminals to an array of input and output signal terminals forming a tray connector which is usually located on one end of the rectangular tray. The tray connectors of the trays inserted into the rack of lateral supports thus face the rear wall of the chamber. The rear panel of the chamber is usually constructed to be removable and adapted to be fitted with an array of spaced apart mating connectors for receiving the tray connectors of the trays mounted in the rack or racks. The rear panel connector array may be connected to a test circuit for supplying signals to and receiving signals from the IC components under test. Such burn-in ovens are typified by the model PBC 2-32 burn-in oven and other ovens sold by Despatch Industries, Inc.

Such high capacity temperature and other environmental chambers designed for micro-circuit manufacturing facilities are used on a continuous basis for conducting burn-in testing and other environmental testing of manufacturing lots. Manufacturing personnel are required to manually load and unload the trays frequently enough during an operating shift that errors may arise from time to time in making an electrically complete connection of all the tray connectors with all the panel mounted connectors. A certain amount of force must be employed to push each tray connector into its mating panel mounted connector during the insertion operation and pull it out in the ejection operation. The mating male and female terminals are precisely dimensioned with close tolerances in order to achieve an adequate electrical connection each time a connection is made. Moreover, the connectors must withstand repeated connect and disconnect operations as well as the temperature and other environmental extremes encountered in the oven or environmental test chamber. Consequently, it takes a fair amount of force to connect the connectors together and to break the connection to remove the trays on completion of a test. Such repetitive effort is fatiguing to operators, particularly in high capacity manufacturing operations.

A need thus exists for a method and apparatus for facilitating the insertion of the tray connectors to make an electrical connection with the panel mounted connectors. A need exists for an automated apparatus for inserting and ejecting the trays to relieve operators from the effort of manually making and breaking the electrical connections and for ensuring that consistent forces are achieved during insertion and ejection.

SUMMARY OF THE INVENTION

It is thus an object of the present invention to provide an automatic method and apparatus for connecting and disconnecting electrical connectors of electronic test trays to and from electrical connectors in a panel of an environmental test chamber at the beginning and end of a test period to insert and eject the test trays.

It is a further object of the present invention to relieve operators of environmental test chambers from the manual effort of inserting and ejecting such electronic test tray connectors into and out of the panel mounted electrical connectors.

It is a still further object of the present invention to employ such an automated method and apparatus to achieve constant and reliable electrical connection of all trays in a rack of trays undergoing tests simultaneously in an environmental test chamber.

Other objects of the present invention are achieved in an apparatus for connecting and disconnecting electrical connectors of electronic component test trays to and from electrical connectors in a panel of an environmental test chamber at the beginning and end of a test period to insert and eject the test trays comprising: a plurality of test trays having a test tray electrical connector and receptacles for receiving electronic components subjected to environmental testing and making connections with test tray conductors which terminate at terminals of each test tray connector; a closed environment test chamber having an access door through which test trays may be inserted or removed from the chamber when open, the test chamber including a plurality of lateral tray supports for slidably receiving and supporting the test trays and aligning the test tray connectors with a plurality of mating electrical connectors arrayed in alignment therewith mounted within the test chamber; and tray insertion and ejection means operable in an insertion and an ejection cycle for automating the connection and separation of the tray and chamber mounted connectors, further comprising: insertion cycle controlling means for sequentially operating the insertion means to sequentially move each tray on its tray support in an insertion direction to connect the tray connector to its mating chamber mounted connector until all trays are inserted and connected; and ejection cycle controlling means for sequentially operating the ejection means to sequentially move each tray on its tray support in an ejection direction to disconnect the tray connector from its mating chamber mounted connector until all trays are ejected and disconnected.

More particularly, the apparatus of the present invention preferably includes a plurality of test trays having a test tray electrical connector and receptacles for receiving electronic components subjected to environmental testing and making connections with test tray conductors which terminate at terminals of each test tray connector; a closed environment test chamber having an access door through which test trays may be inserted or removed from the chamber, the test chamber including a plurality of lateral tray supports for slidably receiving and supporting the test trays and aligning the test tray connectors with a plurality of mating electrical connectors arrayed in alignment therewith mounted within the test chamber; and tray insertion and ejection means including a track guided, carriage mounted, inserter/ejector mechanism operable in an insertion and an ejection cycle for automating the connection and separation of the tray and chamber mounted connectors, further comprising: insertion cycle controlling means for sequentially advancing the carriage along the track from tray to tray and operating the inserter mechanism to sequentially move each tray on its tray support in an insertion direction to insert the tray connector into its mating chamber mounted connector until all trays are inserted and connected; and ejection cycle controlling means for sequentially advancing the carriage along the track from tray to tray and operating the ejection mechanism to sequentially move each tray on its tray support in an ejection direction to eject the tray connector from its mating chamber mounted connector until all trays are ejected and disconnected.

Such apparatus preferably includes a motor and drive train controlled by the insertion and ejection cycle controlling means for moving the carriage for the inserter/ejector mechanism in an insertion and an ejection direction during the insertion and ejection cycles between insertion and ejection positions with respect to each tray.

The inserter/ejector mechanism preferably comprises at least one pivot arm having a pivot point and a free end; means for mounting the pivot arm pivot on said carriage means for allowing pivotal movement of the free end thereof from a pivot rest position through a pivot arc; and wherein: said insertion cycle controlling means further comprises first means for moving the pivot arm through an insertion pivotal movement about its pivot to apply its free end against a tray to move the tray on the lateral tray supports a constant distance, so that the tray connector is connected with the chamber mounted connector; and said ejection cycle controlling means further comprises second means for moving the pivot arm through an ejection pivotal movement about its pivot to apply its free end in contact with the tray to move the tray on the lateral tray supports a constant distance, so that the tray connector is disconnected from the chamber mounted connector.

In this regard, the insertion cycle controlling means and the ejection cycle controlling means effect differing movements of the carriage on its track as well as the pivot arm since the trays must be moved toward their rear panel connectors during the insertion cycle and away from the rear panel in the ejection cycle. To accomplish these operations, the trays further comprise first and second opposed end surfaces formed on the end of the tray opposite to the connector end for engaging with the free end of the pivot arm during operation of the first pivot arm moving means and the second pivot arm moving means, respectively, whereby the free end of the pivot arm bears against the first end surface during pivotal movement of the arm away from the carriage and bears against the second end surface during pivotal movement of the arm toward the carriage. Thus, the ejection cycle controlling means further comprises means operable in sequence in the ejection cycle to effect movement of said carriage to a first tray ejection position with respect to each tray to be ejected, to pivot the pivot arm to an extended position extending alongside the tray to be ejected, to effect movement of the carriage to a second tray ejection position, to pivot the free end of the pivot arm toward the carriage and into engagement with the second end surface, and to return the pivot arm to the rest position, whereby the tray is moved toward the carriage and the tray and chamber mounted connectors are disconnected.

In contrast, the insertion cycle controlling means further comprises means operable in sequence in the insertion cycle to effect movement of said carriage to a tray insertion position with respect to each tray to be inserted, to pivot the free end of the pivot arm through an arc extending toward the tray to be inserted and into engagement with the first end surface to effect movement of the tray away from the carriage, and to return the pivot arm to the rest position, whereby the tray and chamber mounted connectors are connected.

BRIEF DESCRIPTION OF THE DRAWINGS

These and other objects, advantages and features of the present invention will be apparent to those of skill in the art from the following detailed description of the preferred embodiments thereof taken in conjunction with the drawings in which:

FIG. 13 is a flow chart illustrating the tray insertion operating cycle of the apparatus.

DETAILED DESCRIPTION OF THE PREFERRED EMBODIMENTS

Figure 1:
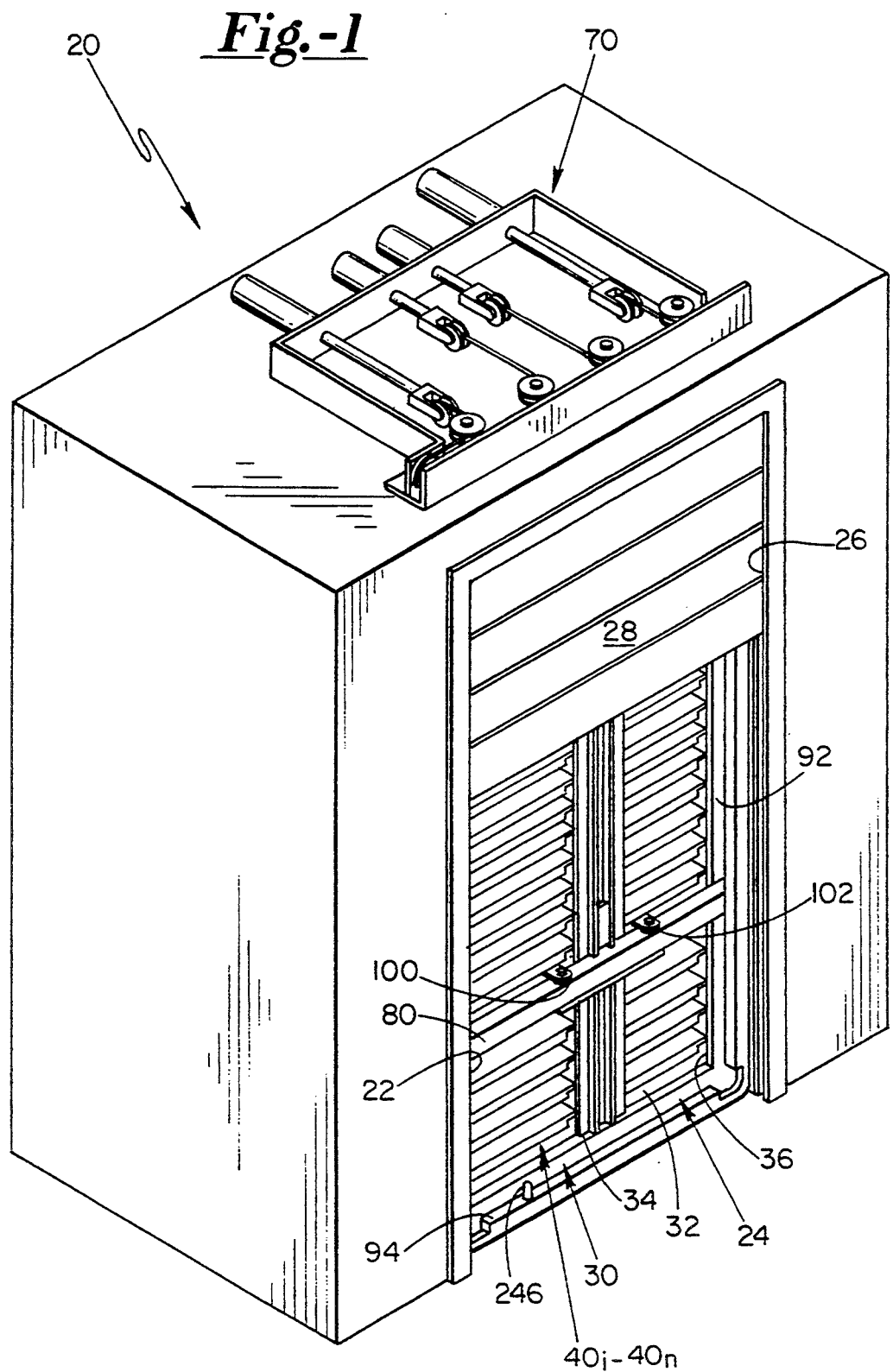
FIG. 1 a perspective view of an oven incorporating the insertion/ejection apparatus of the present invention.

Turning now to FIG. 1, it illustrates in a perspective view an environmental chamber, referred to for convenience, but not as a limitation on the applications of the insertion/ejection apparatus and method, as a burn-in oven 20 having a rectangular interior chamber 22 enclosed by side, top, bottom and rear walls and having a front opening 24 framed by a door frame 26 and adapted to be enclosed by door 28. Door 28 is opened and closed by a motor drive mechanism (not shown in this figure) to move vertically on tracks mounted in the door frame 26 between a closed and a fully open position. In the open position, the sections of door 28 are stored above the door opening 24. The motorized door 28 is insulated and has suitable seals around the frame 26 for heat retention when closed and operates somewhat in the fashion of an electrically controlled multi-section garage door.

A pair of racks 30 and 32 are mounted inside the chamber 22 to each receive a number n, such as 16 or 32, of integrated circuit component trays $40_1$–$40_n$. Each rack 30, 32 includes n/2 sets of laterally spaced apart, tray side supports 34, 36 that are each spaced apart a distance from the other sufficiently to accommodate a tray 40 separated from its neighboring tray by a distance sufficient to allow heated air to freely circulate between the inserted trays $40_1$–$40_n$.

The oven 20 also includes an electronic control panel (not shown) having control switches and display devices mounted thereon and containing various electronic controls, motors, fans and heating equipment for establishing and controlling the thermal conditions within the chamber 22 in a manner well known in the art.

Figure 2:
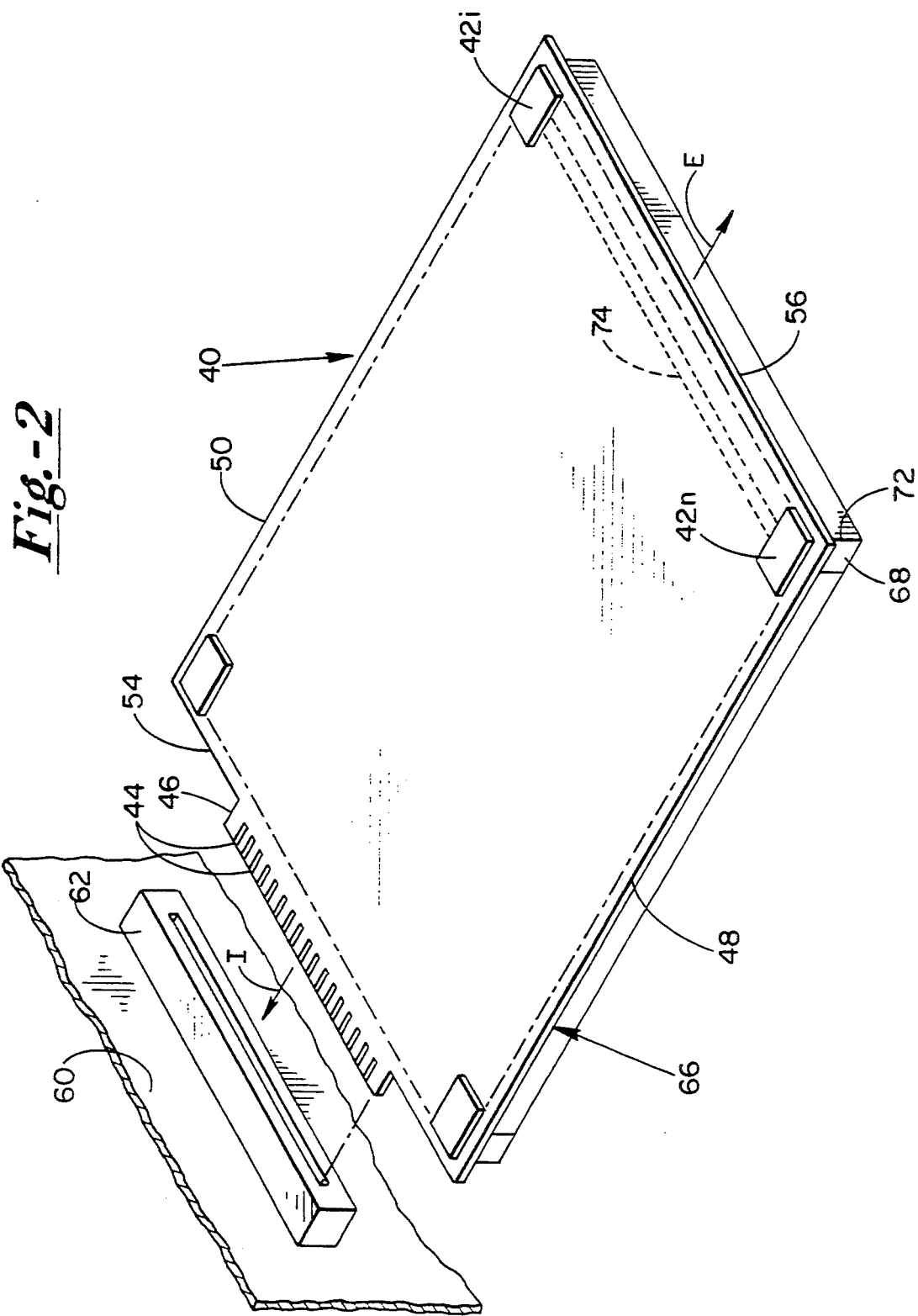
FIG. 2 perspective view of a typical component tray usable in the oven depicted in FIG. 1.

Turning now to FIG. 2, it illustrates in a perspective, top view, one of the trays 40 which may be inserted into the racks 30, 32. The trays 40 are of a conventional design containing a number of IC component receptacles $42_1$–$42_N$, where N may (or may not) be equal to a binary number such as 16, 32 or 64, for receiving a like number of IC components for testing. Each of the receptacles $42_1$–$42_N$ have a number of terminal pins (not shown) that are electrically connected in parallel with printed circuits (not shown) imprinted within or on the surface of the trays $40_1$–$40_n$, and terminate in a plurality of terminals 44 arrayed in a connector 46 projecting to the rear of the rectangular, flat body of each tray 40.

The sides 48 and 50 of each tray 40 rest on the tray supports 34 and 36 (not shown in FIG. 2) when the trays $40_1$–$40_n$ are inserted into the racks 30 and 32. The perspective illustration of FIG. 2 shows that the trays $40_1$–$40_n$ are moveable in the insertion direction I or the ejection direction E with respect to the opening 24 in the oven 20. Thus, the ends 54 and 56 of each tray 40 are referred to as the rear or tray connector end and the front end, respectively.

The oven 20 is also provided with a removable rear chamber wall or panel 60 in which an array of n wall or panel mounted mating connectors $62_2$–$62_n$ are mounted so as to be aligned with and make electrical contact with the connectors $46_1$–$46_n$ of the trays $40_1$–$40_n$. Each of the n rear wall or panel connectors 62 include a plurality of electrical terminals or contacts that are aligned to make electrical contact with the terminals or contacts 44 of each connector 46. For example, the tray connectors $46_1$–$46_n$ may constitute a male, multi-terminal/contact connector formed as part of the printed circuit of each tray 40, and the rear wall/panel connectors $62_2$–$62_n$ may be model EZC36DRYN-S13 female connectors from Sullins Electronics Corp. or any suitable female connectors.

The burn-in oven 20, racks 30, 32 and trays $40_1$–$40_n$ and their associated components described to this point are well known in the prior art. The oven 20 is described to this point is preferably the Despatch Industries, Inc. model PBC 2-32 burn-in oven which may be configured as described to receive the n test trays and conduct thermal tests of the IC components mounted therein. In such a system as described, the operator is required to manually slide the trays 40 onto the lateral tray supports 34, 36 until all of the trays are loaded in the racks 30, 32. The operator exerts force against the front end 56 of each tray 40 in the tray insertion direction I to force each tray connector 46 into each panel or wall mounted connector 62 a certain distance until the tray appears to be firmly seated. After all of the trays are loaded, the door 28 is closed and the test is conducted.

Upon completion of the test, the operator must open the door and manually pull on the front edge 56 of each tray 40 to release the tray connector 46 from the mating wall/panel mounted connector 62 in the ejection direction 52. The repeated effort expended over an operator's work shift may prove fatiguing, and fatigue-induced errors in inserting or removing trays may result in damage to the trays, the oven or the components mounted on the trays.

In accordance with the present invention, the insertion and ejection of the tray connectors with the wall or panel mounted mating connectors is automated by an apparatus shown in part in FIG. 1 and in detail in the remaining figures. Moreover, in order to facilitate the ejection of the trays $40_1$–$40_n$, each tray is provided with an elongated bar-shaped member 68 extending in parallel with the front edge 56, preferably on the lower surface 66 of the tray. Each tray 40 is thus modified to provide a first, front-facing surface 72 and a second, rear-facing surface 74 on the member 68. In accordance with the invention, force is exerted in the insertion cycle in the direction I against the first surface 72 and, in the ejection cycle, in the direction E against the second surface 74 to move each tray 40 a constant distance in each direction during each cycle.

The portions of the insertion and ejection apparatus shown in FIG. 1 comprises a carriage 80 extending horizontally across the oven opening 24 and guided at its opposite ends by a pair of tracks 90 and 92 (track 90 is obstructed from view by frame 26 in FIG. 1). The carriage 80 carries a pair of inserter/ejector mechanisms 100 and 102 that are driven by a cable and an inserter/ejector pneumatic air cylinder and pulley assembly 70, under the control of the pneumatic system depicted in FIG. 9 and the electronic control system and flow charts depicted in FIGS. 12–14, to effect the controlled, constant distance movement of the trays $40_1$–$40_n$ in the insertion direction I and the ejection direction E.

Figure 3:
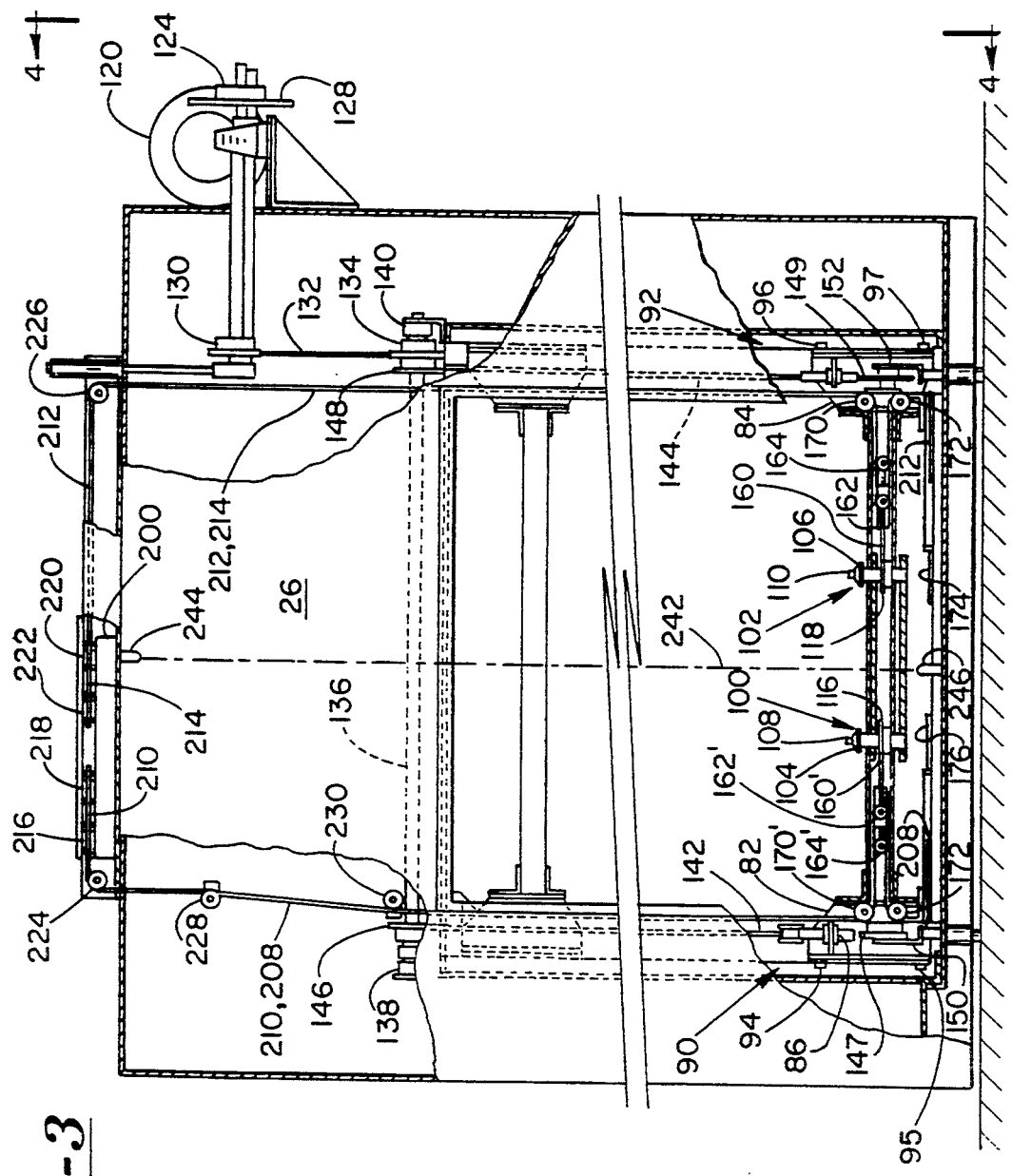
FIG. 3 is a front elevation view of the apparatus of the present invention.
Figure 4:
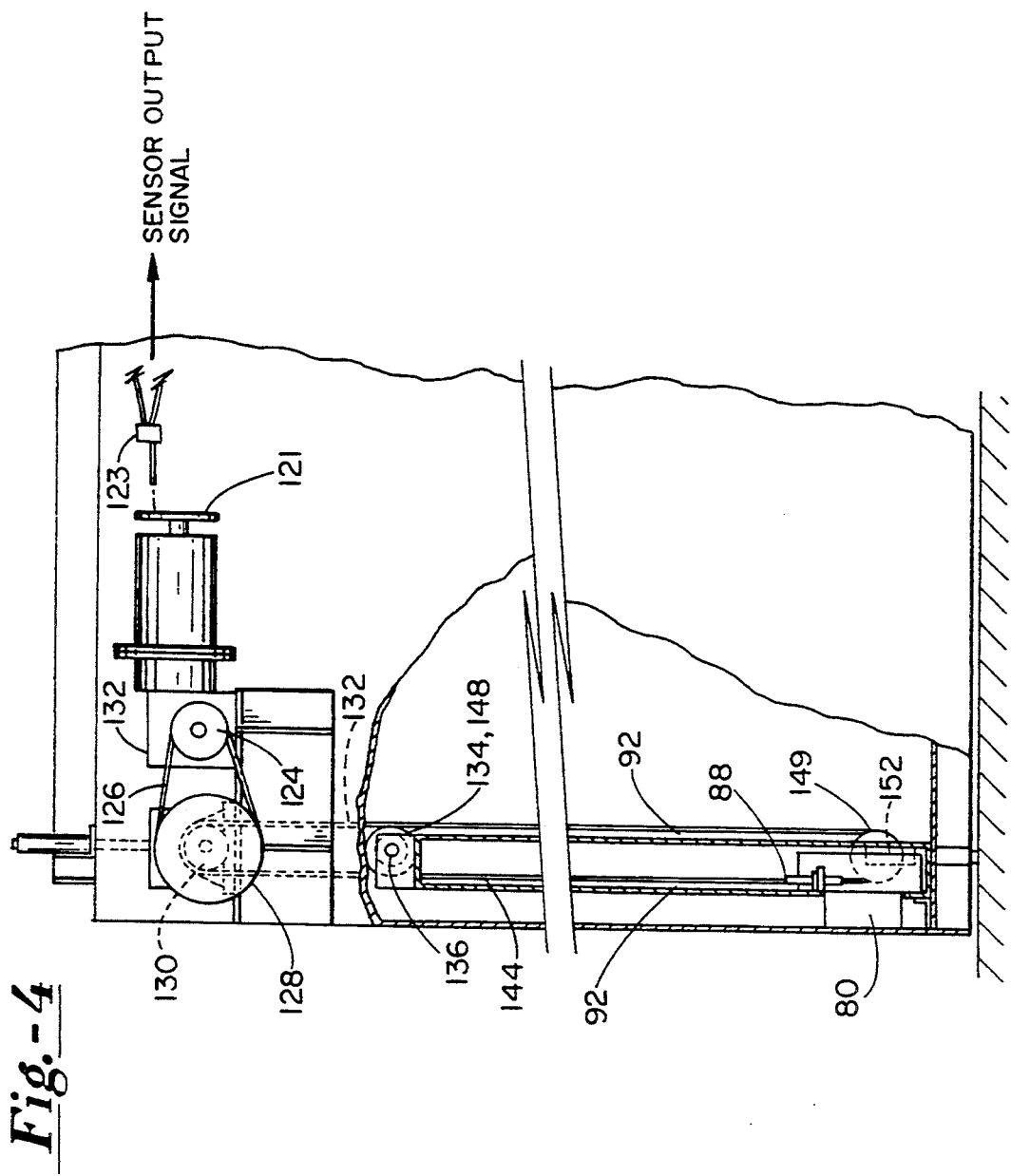
FIG. 4 is a side elevation view of the apparatus depicted in FIG. 3.
Figure 5:
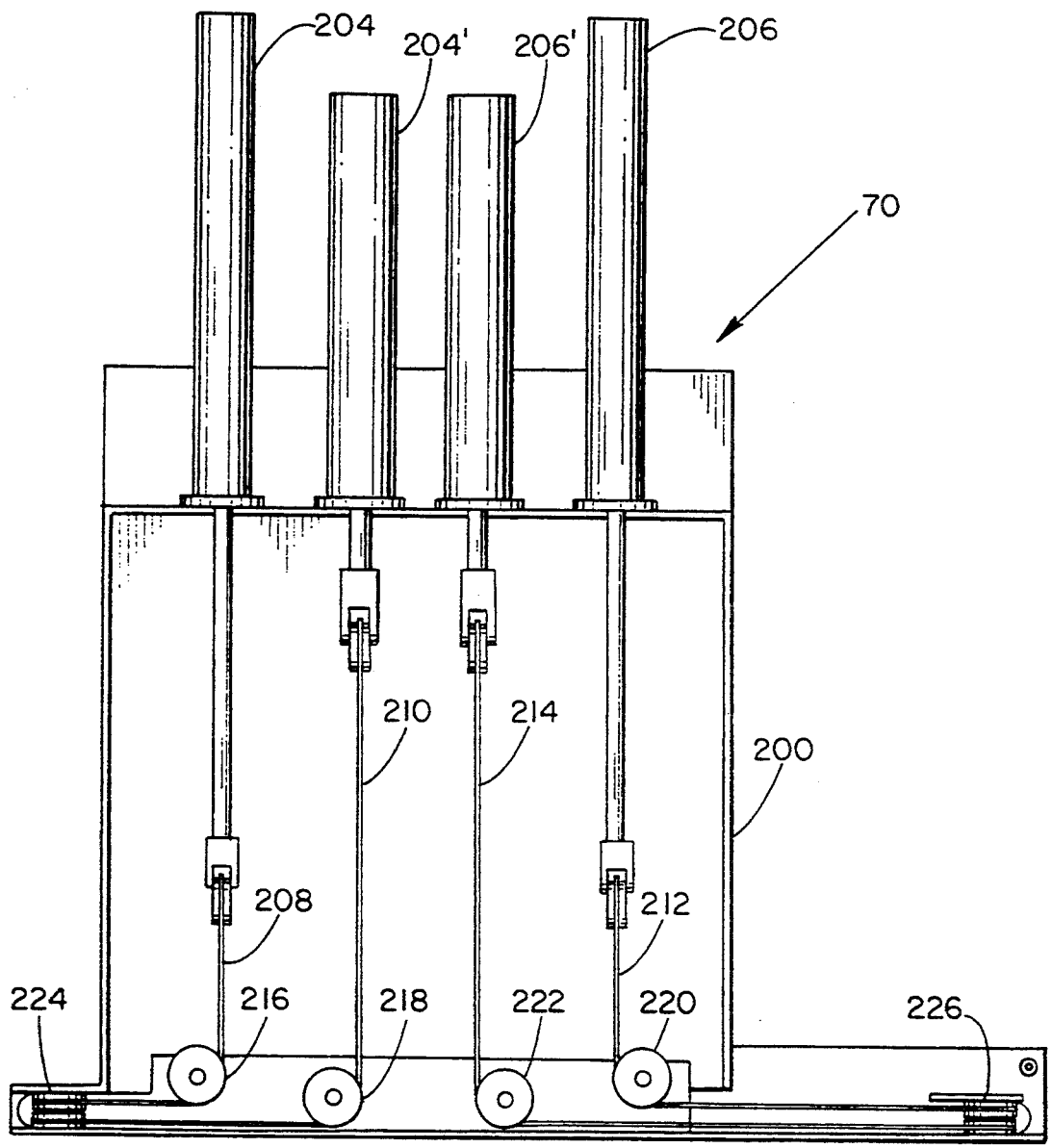
FIG. 5 is a top view of the insertion/ejection air cylinders that are operated to effect the pivoting motion of a pair of pivot arms mounted on the carriage depicted in FIG. 3.

In reference to FIGS. 3 and 4, the insertion and ejection apparatus also includes a drive motor 120 which operates a drive transmission 122 coupled to the carriage 80 to effect its vertical movement up and down the door frame 26 on the tracks 90, 92 during the tray ejection and tray insertion cycles. The drive mechanism is optimally configured to fit inside the door 28 so that it is entirely enclosed (with the exception of the motor, pneumatic air cylinders and control circuits which are separately enclosed) within the oven chamber 22 during a burn-in test.

In the insertion cycle, when trays are to be inserted, the carriage 80 is positioned below the racks 30, 32, and the racks are manually loaded with the trays $40_1$–$40_n$ a sufficient distance so that each tray edge 56 does not interfere with the vertical movement of the carriage 80. When all of the trays are loaded, the operator commences the automated insertion cycle by entering the appropriate command on the control panel, and the drive motor 120 commences to move the carriage 80 upward to the lower-most insertion position adjacent to the lower-most pair of side by side trays $40_{n-1}$, $40_n$.

As explained in connection with FIGS. 13 and 14, the electronic control system causes the drive motor 120 to halt at the desired insertion or ejection position and energizes the pneumatic system depicted in FIG. 9 to cause the insertion or ejection cylinders to operate the inserter/ejector mechanisms 100, 102 to exert force in the insertion direction I against the front-facing surface 72 of each tray. Upon completion of the movement of the inserter/ejector mechanisms 100, 102 (to be described), during the insertion cycle the electronic control system of FIG. 12 causes the drive motor 120 to advance the carriage 80 upward to the next insertion position whereupon the insertion operation is repeated. The carriage 80 is sequentially advanced through the remaining insertion positions, and the insertion operation is repeated at each insertion position until all of the trays are inserted and the carriage 80 is positioned adjacent the last insertion position at the top of the chamber opening 24.

The carriage 80 is desirably provided with a tray position trip sensor 240 (described particularly with regard to FIGS. 10 and 11) for detecting out of position trays that would interfere with and be damaged by the carriage 80 as it moves upward during the insertion cycle. The tray position trip sensor 240 thus extends in the path of travel during the insertion cycle, and, if it contacts an out of position front tray edge 56, it pivots outward and interrupts an infrared light beam. This interruption causes the generation of a trip signal which halts operation of the drive motor 120 and, optionally, sounds an alarm to alert the operator to move the detected tray in the insertion direction I until it clears the trip sensor 240. Once the position of the misaligned tray has been manually adjusted, the insertion operation can continue.

Figure 11:
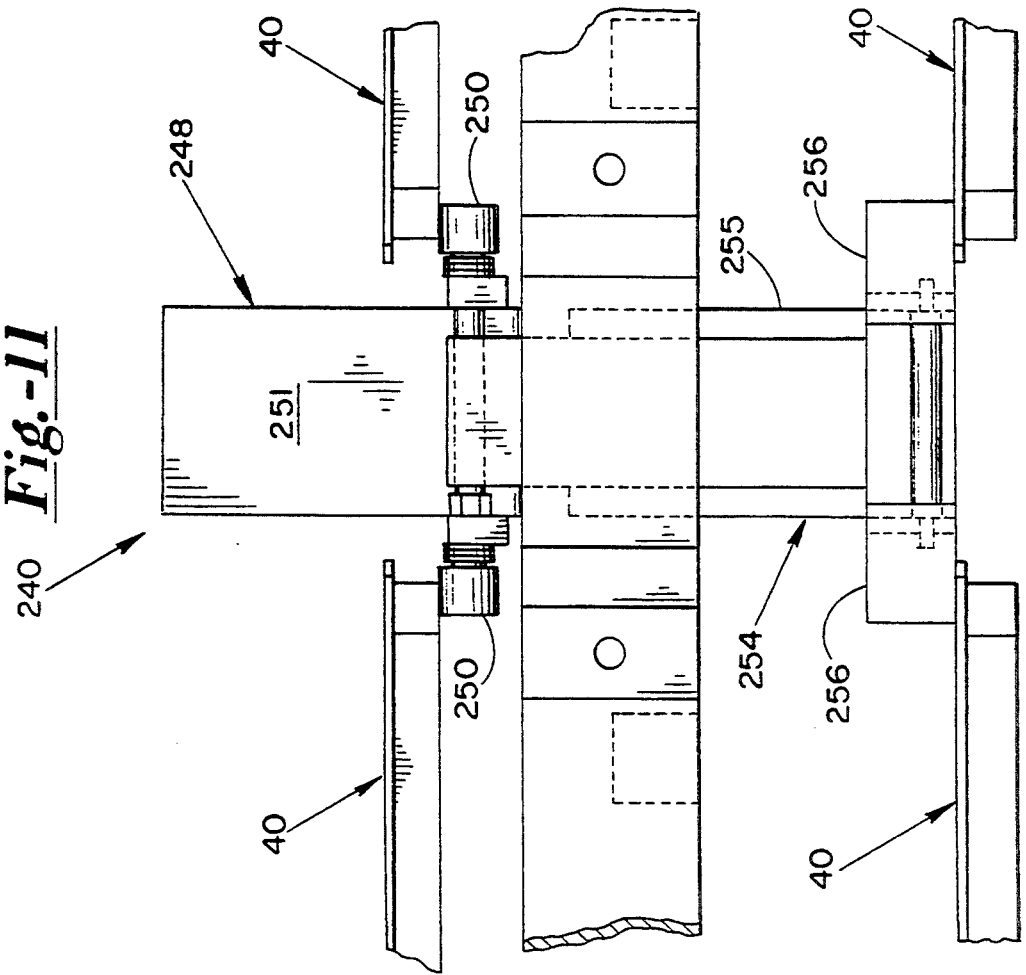
FIG. 11 is a front elevation view of the sensing mechanism of FIG. 10.
Figure 10:
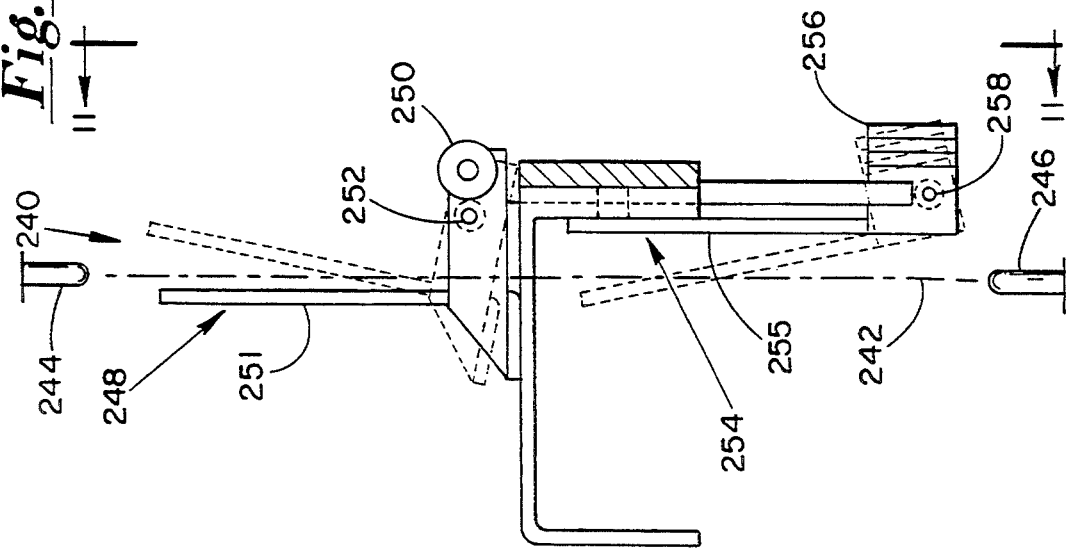
FIG. 10 is a side view of an extended bib sensing mechanism for detecting out of position component trays and providing a trip signal to halt advancement of the carriage.

Turning now to FIGS. 10 and 11, they illustrate a preferred embodiment of a trip mechanism 240 that is mounted at the center of the carriage 80 and operates to interrupt an infra-red light beam 242 emitted by a source 244 and detected by a photocell 246 in the event that an out-of-position tray trips insertion trip lever 248 or ejection trip lever 254 which extend toward the rear wall of the oven from a rear-facing edge of the carriage 80, i.e the edge of the carriage toward the interior of the oven. The light source 244 and photocell 246 are mounted to direct and intercept the light beam 242 traversing the opening 24. In one preferred embodiment, the light source 244 is carried by the housing adjacent the top of the frame 26 of the opening and the photocell 246 is carried on a cross bar 94 (see FIG. 1) adjacent the bottom of the frame 26.

The insertion trip lever 248 of the trip mechanism is positioned along an upper edge of the carriage 80 and includes a pair of tray abutting rollers 250 which extend rearwardly of the carriage, i.e toward the trays installed in the oven. As best seen in FIG. 10, the normal position of the insertion trip lever (shown in solid lines in FIG. 10) positions an opaque plate 251 out of the path of the light beam 242 of the trip sensor. When a roller 250 of the insertion trip lever 248 contacts a tray 40 as it moves upwardly, the trip lever will rotate out of its normal position about a pivot axis 252. As illustrated in phantom lines in FIG. 10, such movement of the trip lever 248 will position the plate 251 in the path of the light beam 242, blocking the light before it reaches the photocell 246. This will, in turn generate a signal to indicate that a tray is out of position and halt upward movement of the carriage, as noted above.

The trip sensor 240 shown in the drawings also includes an ejection trip lever 254. This trip lever is adapted to block the light beam 242 if a tray is out of position during the ejection cycle of the mechanism, as detailed below. The structure of the ejection trip lever 254 is analogous to that of the insertion trip sensor 248 outlined above and includes contact pads 256 which extend rearwardly of the carriage 80. When one of the contact pads 256 encounters an out of position tray as the carriage moves, the ejection trip lever 254 will pivot about a pivot axis 258 to position an opaque plate 255 in the path of the light beam 242, as illustrated in phantom lines in FIG. 10. This interruption of the light beam will generate a signal indicating that a tray is out of position and halt downward movement of the carriage.

Once all of the trays are properly inserted, the door 28 of the oven may be closed to provide an enclosed chamber 22. The desired testing protocol may then be carried out to test the IC components 42 on the trays 40. For instance, the temperature in the oven may be elevated to an anticipated maximum use temperature of the IC components and the behavior of these IC components may be measured at temperature to detect faulty components.

When the test protocol is completed, the door 28 may be opened and the ejection cycle may be initiated. This may be done automatically or by having an operator enter the appropriate command on the control panel. During the ejection cycle, the drive motor 120 lowers the carriage to the first ejection position, which is adjacent the position of the top-most pair of component trays $40_1$ and $40_2$. The movement of the carriage to the ejection position involves a two step process to be explained in detail hereafter.

Figure 9:
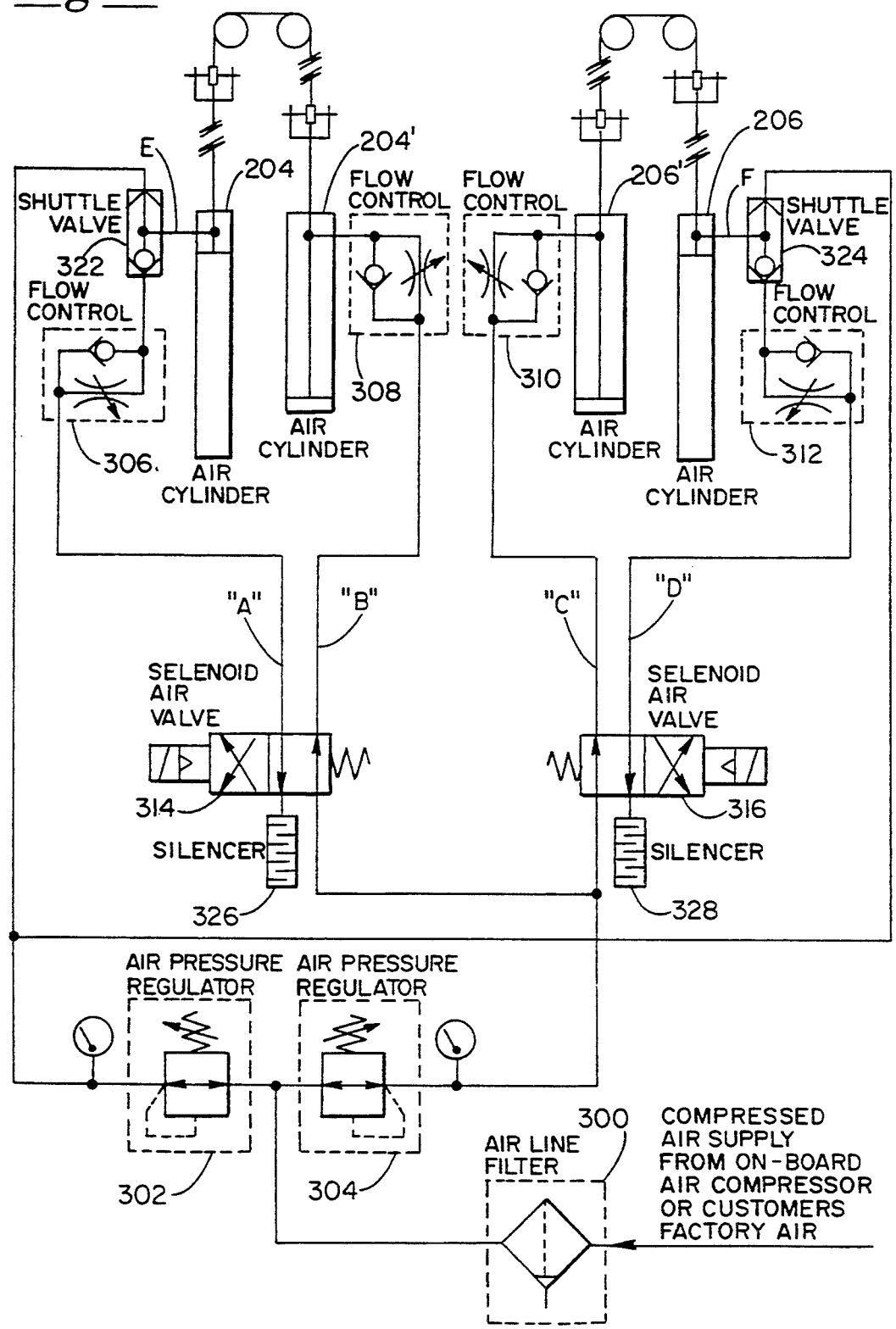
FIG. 9 is a schematic illustration of the air cylinder control system for the ejection/and insertion cylinders depicted in FIG. 4.
Figure 12A:
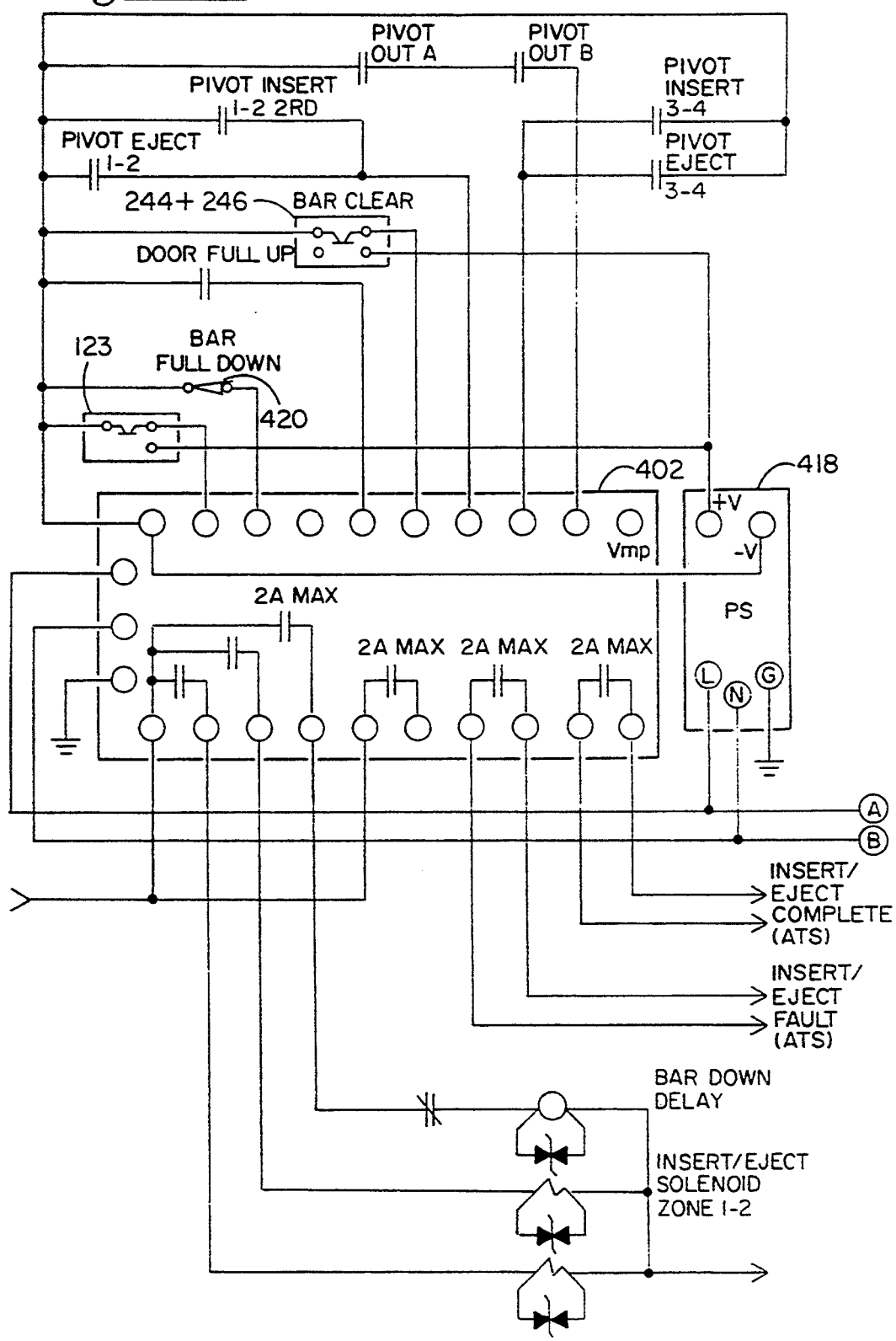
FIGS. 12A and 12B and an electrical schematic of one possible electrical control system for operating the apparatus in the insertion and ejection cycles.
Figure 12B:
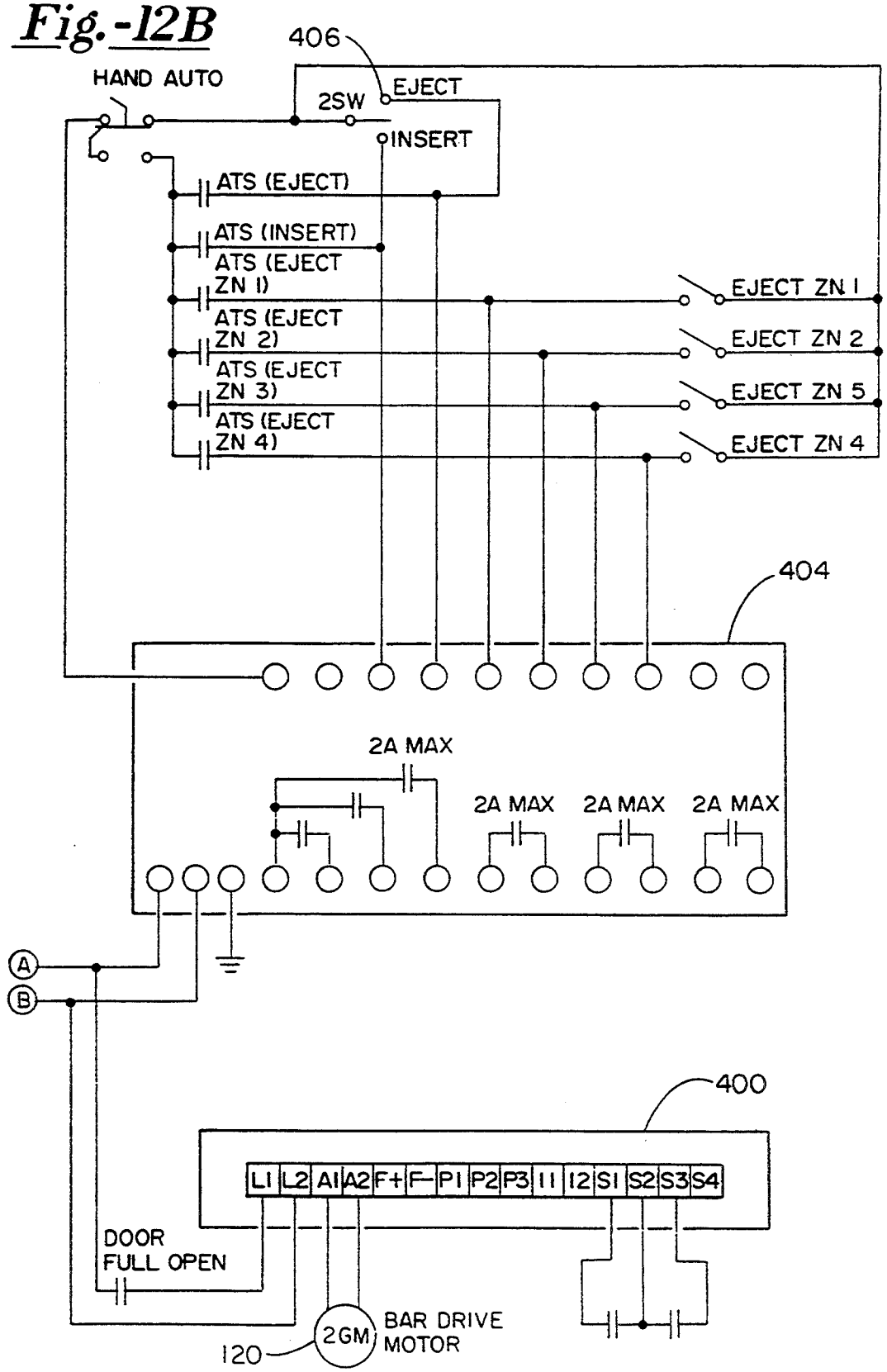
Figure 14:
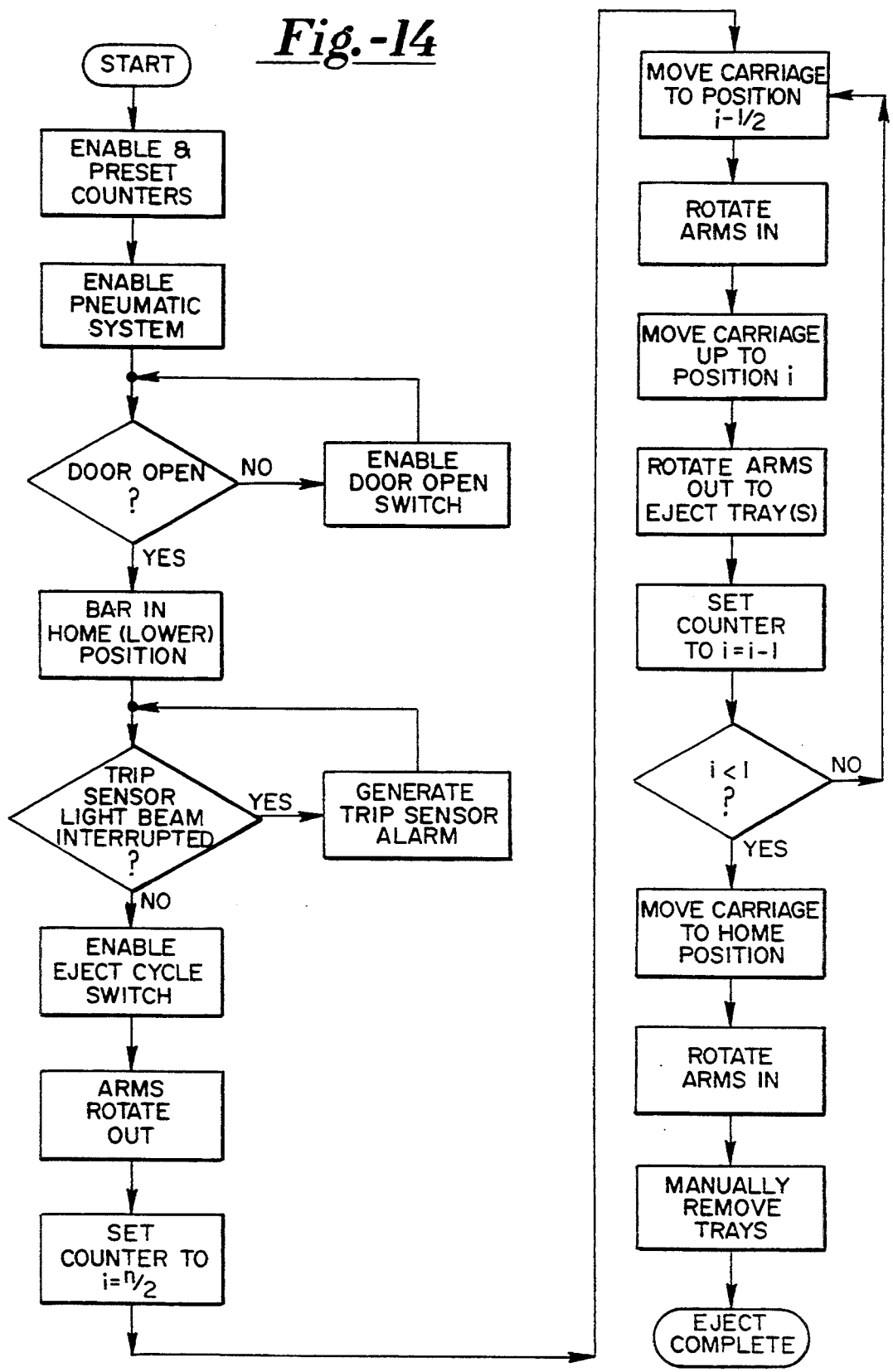
FIG. 14 is a flow chart illustrating the tray ejection operating cycle of the apparatus.

In each ejection position, the inserter/ejector mechanisms 100, 102 are moved in the ejection mode by the eject air cylinders under the control of the pneumatic system depicted in FIG. 9, the electronic control system of FIG. 12, and the flow chart of FIG. 14, so that each inserter/ejector mechanisms 100, 102 contacts the second, rear-facing surfaces 74 of the two side by side trays 40 and applies force thereto to move the trays in the eject direction E. Upon completion of the ejection, the control system causes the drive motor 120 to lower the carriage 80 to the next ejection position and to repeat the process of ejecting the pair of trays located at that position. This sequence of operations continues until all trays $40_1$–$40_n$ are ejected and the carriage 80 rests at the bottom on the opening.

Thus, the carriage 80 is returned to the default insertion position, i.e., below the lower-most tray in FIG. 1. The operator may then remove the tested set of trays $40_1$–$40_n$ and load the next set of trays to be inserted and subjected to the high temperature or other environmental test conducted within the chamber 22.

Figure 6:
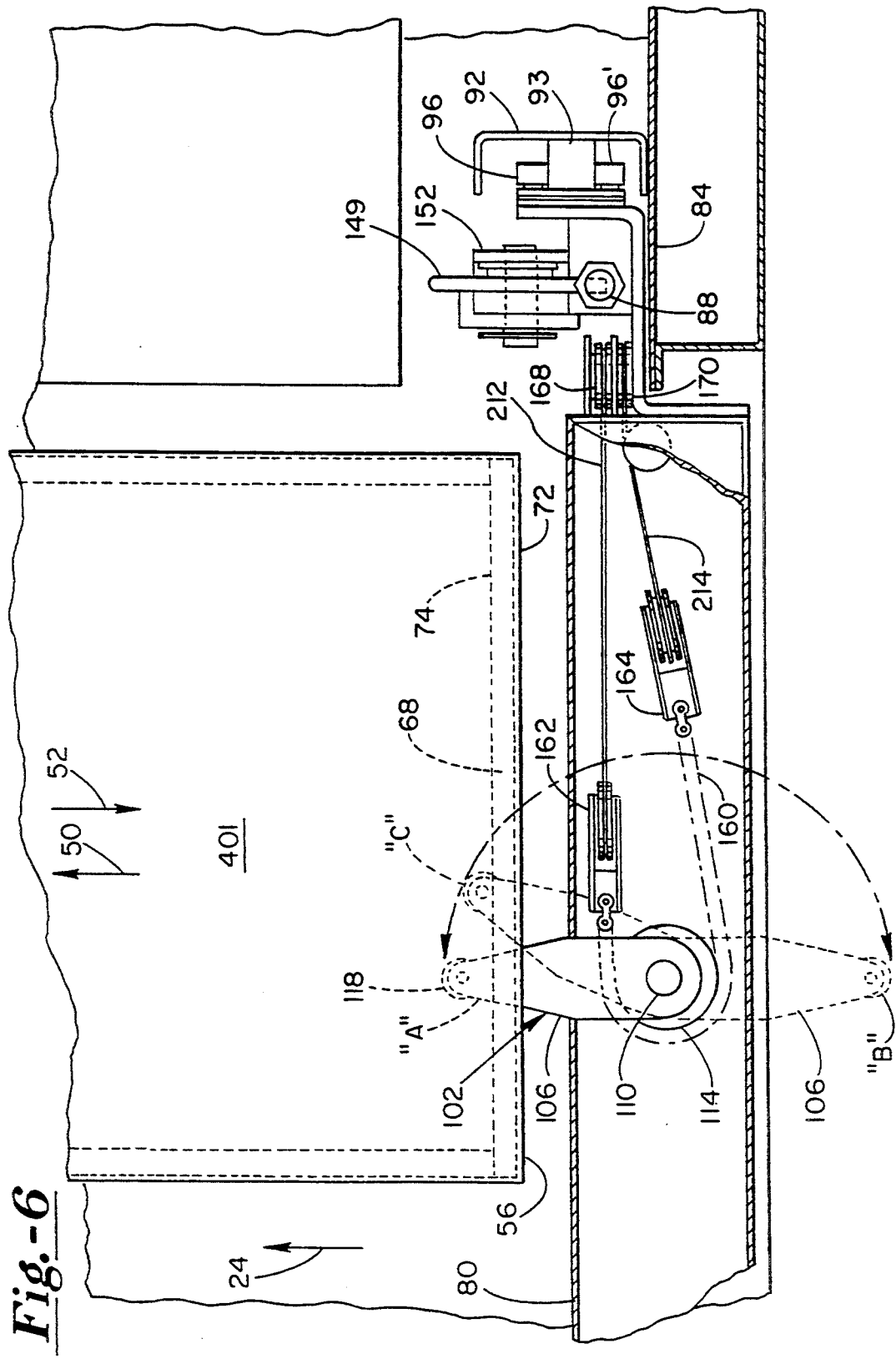
FIG. 6 is a top view of one of the pivot arms depicting the pivot arcs of its free end pivoting in the insertion and ejection cycles.
Figure 7:
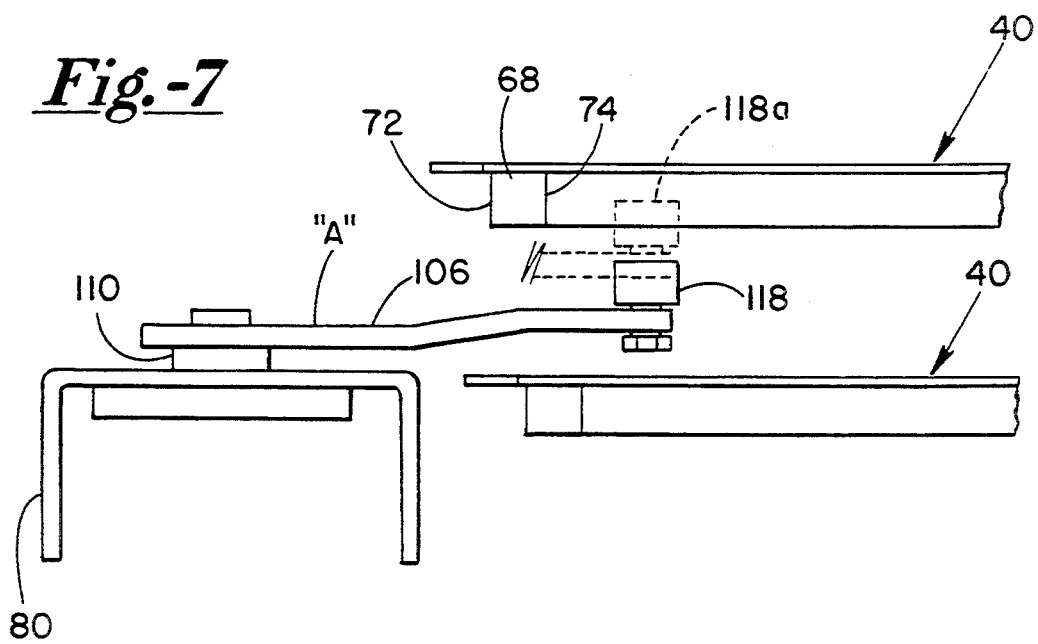
FIG. 7 is a side view illustration of the vertical travel of the carriage between first and second tray ejection positions during the ejection of each tray in the ejection cycle.
Figure 8:
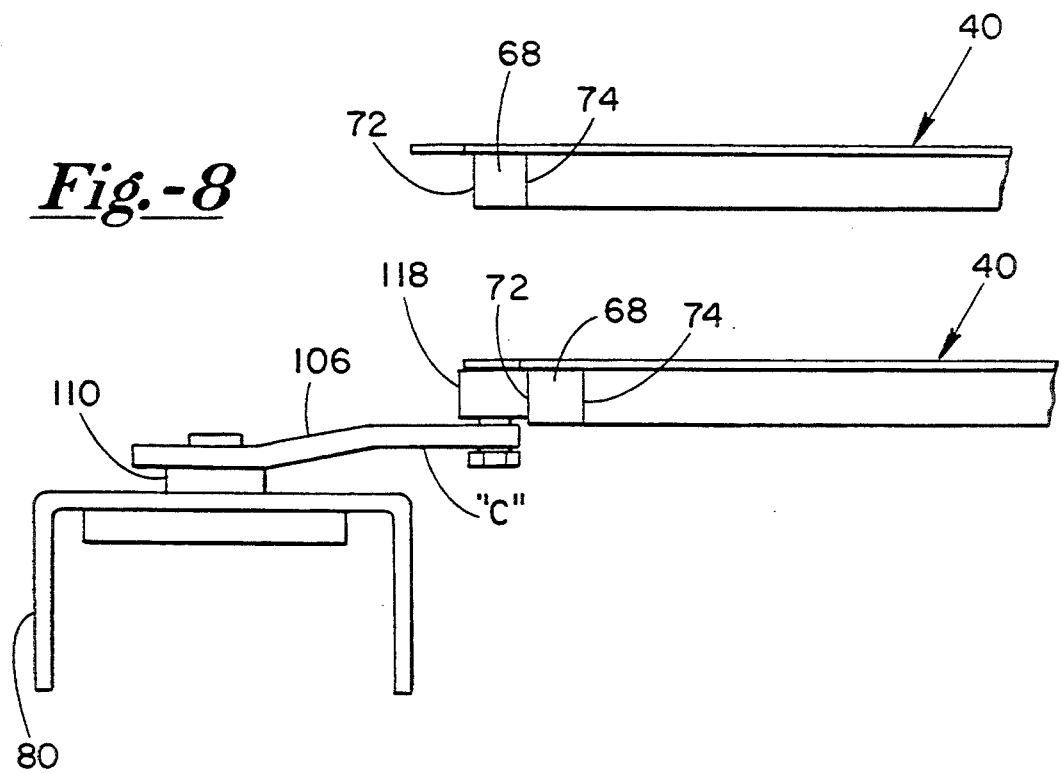
FIG. 8 is a side view illustration of the vertical travel of the carriage into a tray insertion position during the insertion of each tray in the insertion cycle.

The remaining FIGS. 3–14 illustrate the details of the automatic insertion/ejection apparatus and the method of operation of the invention summarized above. As shown more clearly in FIG. 3, in this preferred embodiment, the inserter/ejector mechanisms 100, 102 constitute pivot arms 104, 106 mounted on pivots 108, 110 in the carriage 80. Each pivot arm 104, 106 desirably has a freely rotatable wheel 116, 118 at its respective free end. A pair of drive mechanisms operate under the control of the pneumatic air cylinder and pulleys to rotate the pivot arms 104, 106 about their respective pivots 108, 110 so that the wheels 116, 118 at the free ends thereof contact and move the first and second surfaces 72 and 74 in the injection direction I during the injection cycle and in the ejection direction E during the ejection cycle. The details of the inserter/ejector mechanisms so described are depicted in FIGS. 6–8 in conjunction with the pneumatic system schematic drawing of FIG. 9.

Turning now to the front and side elevation views of the inserter/ejector apparatus 70 depicted in FIGS. 3 and 4, respectively, the carriage 80 is generally constructed of an elongated, rectangular hollow metal tube mounted at each end to flange assemblies 82 and 84 that are adapted to ride in guides formed within the vertically extending tracks 90 and 92, respectively, and to be moved upward and downward during the insertion and ejection cycles previously described by operation of the motor 120 and drive transmission 122. The motor 120 is operated under the control of a rotation sensor attached thereto and the electrical control system of FIG. 12 and the flow charts of FIGS. 13 and 14 to rotate the sprocket 124 and chain 126 to in turn rotate sprocket 128 which is mounted via a drive shaft to a chain drive sprocket 130.

The rotation sensor may comprise an encoder disk 121 attached to rotate with the motor 120 drive shaft and an optical sensor 123 that provides a pulse signal each time the disk 121 makes a complete revolution. The optical sensor 123 may, for example, detect a segment of the disk 121 treated to have a different reflectance than the remainder of the disk 121 in a manner well known in the art. Since the motor 120 is coupled to the chain drive socket 124 through a reduction gear box, it makes a number of revolutions that can be counted accurately for each complete and partial revolution of the chain drive sprocket 128.

As schematically shown in FIG. 12, the rotation sensor 123 may be coupled with the rest of the electronic control system to indicate the position of the carriage 80 along its travel. This permits the electronic control system to use a series of predetermined encoding signals to determine predetermined insertion positions and ejection positions of the carriage. As explained below in connection with FIGS. 13 and 14, this permits the carriage to be easily moved to the desired positions during the insertion and ejection cycles to carry out the desired function.

If so desired, a mechanically activated relay switch (422 in FIG. 12) or the like can be used in conjunction with a controller 400 for the motor 120. Such a relay can prevent the carriage (also referred to as a "bar" in FIG. 12) from being driven below a predetermined bottom, or "home" position. In the event the rotation sensor slips for any reason, such a relay will prevent the apparatus from damaging itself by attempting to move the carriage too far.

A primary chain 132 extends around sprocket 130 and onto sprocket 134 which is mounted to a drive shaft 136 which extends across the top of the door frame 26 between a pair of bearings 138 and 140. Thus, the motor 120, when intermittently operated, rotates the drive shaft 136 in the clockwise or counterclockwise directions in order to raise or lower, respectively, the carriage 80 across the door opening 24.

The raising and lowering of the carriage 80 is accomplished by the chains 142 and 144 which each extend around a pair of sprockets 146 and 148, respectively, mounted to the drive shaft 136 and a pair of stationary sprockets 147 and 149. The stationary sprockets 147 and 149 are mounted on bearing assemblies to brackets 150 and 152, respectively, that are attached to the door frame 26 at the bottom of the chamber opening 24.

In operation, the step-wise rotation of the drive motor 120 in turn rotates the primary chain drive 130, 132 and 134 in order to rotate the secondary chain drive 136–152. The raising and lowering of the carriage 80 is accomplished by the fixed attachment of the carriage flange assemblies 82 and 84 by the chain drive mounting clips 86 and 88 to the secondary chains 142 and 144, respectively, such that the vertical movement of the chains effects the vertical movement of the carriage 80.

The vertical movement of the carriage assembly 80–88 with respect to the vertical tracks 90, 92 is facilitated by the respective pairs of cam followers or guide wheels 94, 95 and 96, 97 that ride within the U-shaped vertical tracks 90 and 92. In reference to the top view of FIG. 6, it may be seen that the U-shaped vertical track 92, for example, is formed within an internal guide bar 93 against which a top most pair 96, 96' of wheels mounted to the flange assembly 84 ride. Thus, the vertical movement of the carriage 80 can be securely guided by the wheels following the track surfaces within the vertical guide tracks 90 and 92 so that it will not swing back and forth with respect to the chamber opening 24.

Turning now to the details of the structure and operation of the inserter/ejector mechanisms 100, 102, it may be seen from FIGS. 3 and 6–8 (in particular reference to the inserter/ejector mechanism 102), that each mechanism includes a pivot arm 104 or 106 that pivots on pivot bearings 108, 110 mounted in the carriage 80 under the control of an inserter/ejector drive mechanism coupled to the sprockets 112 and 114, respectively, mounted on the pivot axes.

Referring to the top view of inserter/ejector mechanism 102 illustrated traversing its path of travel with respect to tray $40_i$ in FIG. 6, it may be seen that the pivot arm 106 includes a guide wheel 118 mounted for free rotation on the free end of the pivot arm 106 that bears against and rolls along the first and second tray surfaces 72 and 74. FIG. 6 also shows the attachment of the pivot arm 106 to the pivot point defined by the axis of the pivot bearing 110 mounted to the carriage 80.

The pivotal movement of the pivot arm 106 is governed by the sprocket 114 which rotates or pivots the arm 106 through two paths of travel, to be described, under the control of a pivot chain 160. The pivot chain is connected at its free ends through block and tackle type, chain and cable connecting pulleys 162 and 164 to a pair of cables 212 and 214, which cables extend around a respective pair of pulleys 168 and 170 that are connected through appropriate bearings to the flange assembly 84. The cables 212 and 214 extend around the pulleys 162 and 164, respectively, and around further pulleys illustrated in the other figures to be described and are connected to the pneumatic air cylinder and pulley assembly 70 of FIGS. 1 and 5. Suffice it to say that pivotal movement of the pivot arm 106 is effected by lateral movement of the pivot chain 160 caused by one or the other of the cables 212 or 214 drawing pulleys 162 or 164 away from pivot sprocket 114.

The pivot arm 106 is normally in the position "B", i.e., extending generally away from the chamber opening 24 and the trays $40_i$–$40_n$, while the carriage 80 is moved vertically from one insertion or ejection position to the next such position. FIG. 6 also illustrates the tray $40_i$ viewed from the top. The tray $40_i$ has its front end 56 extending over the first surface 72, which faces toward the carriage 80, and the second surface 74, which faces toward the chamber opening 24. As described above, the first and second surfaces 72 and 74 are desirably formed at the front and rear of bar-shaped member 68 formed on the undersurface of each tray $40_i$. FIGS. 6–8 illustrate the interaction of the pivot arm 106 with the first and second surfaces 72 and 74 of the bar-shaped member 68 in the ejection mode (FIG. 7) and the insertion mode (FIG. 8).

As schematically depicted in FIG. 7, the carriage 80 in its ejection mode is moved downward from its starting position at the top of the door frame 26 to an intermediate ejection position between the first and second pairs of trays $40_1$, $40_2$ and $40_3$, $40_4$ and halted there. The inserter/ejector control system (to be described) operates to pivot the pivot arm 106 from its rest position "B" toward the position "A" depicted in FIGS. 6 and 7. Thereafter, the drive motor 120 and drive transmission 122 are operated to raise the carriage 80 to the ejection position. In the carriage's ejection position, the wheel 118 is disposed adjacent the second surface 74 as illustrated in the dotted lines designated 118$a$ in FIG. 7.

Then, the electronic control system of FIG. 12 operates the pneumatic control system of FIG. 9 to cause the arm 106 to pivot back to position "B". This applies force against surface 74 and urges the tray $40_2$ (in this instance) forwardly out of the chamber opening 24 so that the respective tray mounted connector $46_2$ is disconnected from the rear wall/panel connector $62_2$ (not shown).

Thereafter, the drive motor 120 and the drive transmission 122 are operated under the control of the electrical operating system of FIG. 12 and flow chart of FIG. 14 to move downward to the next intermediate ejection position, whereupon the process is repeated. In this fashion, the parallel stack of odd-numbered trays $40_1$–$40_n$ are ejected by the left-hand side pivot arm 104. The right-hand side pivot arm 106 goes through an analogous operation to eject the adjacent stack of even-numbered trays $40_2$–$40_n$. Since both pivot arms are mounted in the same carriage 80, movement of the carriage positions both arms 104, 106 for substantially simultaneous movement to eject side-by-side pairs of trays, e.g. $40_1$ and $40_2$.

Although the depicted embodiment shows a pair of generally parallel stacks of trays, it should be understood that only a single stack may be used or, alternatively, more than two stacks can be employed. Regardless of the arrangement of the trays, one arm should be associated with each vertical stack to insert and eject trays in the stack.

The insertion mode of operation of the inserter/ejector mechanism 70 is schematically illustrated in FIG. 8. The drive motor 120 and the drive transmission 122, operating under control of the electrical control system of FIG. 12 and the flow chart of FIG. 13, moves the carriage 80 upward from its initial position at the bottom of the door frame 26 until the bottom-most insertion position is reached, whereupon further travel is halted. In this mode, the pivot arms 104 and 106 are moved from the position "B" in the counterclockwise direction as illustrated in FIG. 6 so that the wheels 116 and 118 of the pivot arms 104 and 106, respectively, contact the first surface 72 of the bar-shaped member 68 of each tray $40_{n-1}$ and $40_n$ and push the trays $40_{n-}$ and $40_n$ in the insertion direction I.

The path of travel in the counterclockwise direction of the pivot arms 104 and 106 is desirably restricted to about 150° to position "C", whereupon the pivot arms 104, 106 are pivoted in the clockwise direction back to the position "B." Thus, in the insertion cycle, the path of travel is limited so that the trays $40_1$–$40_n$ are inserted in the insertion direction I only a distance sufficient to accurately seat the tray connectors $46_1$–$46_n$ in the panel/wall mounted connectors $60_1$–$60_n$.

Turning now to the pneumatic system for effecting the controlled pivoting motion of the pivot arms 104 and 106 in the insertion and ejection operations described above, the system operates in accordance with the schematic diagram of FIG. 9 under the control of the electronic control system of FIG. 12 and the flow charts of FIGS. 13 and 14. This system includes the inject/eject air cylinder array depicted in the top view of the assembly of FIG. 5 and a cabling and pulley system shown attached to the chain and cable connecting blocks (162 and 164 for pivot arm 106 previously described in referenced FIG. 6) extending around the pivot sprockets 112 and 114 of the pivot arms 104 and 106, respectively. In reference to FIG. 5, and eject/insert air cylinder supporting frame 200 supports eject air cylinders 204 and 206 and insert air cylinders 204' and 206' for the pivot arms 104 and 106, respectively. The air cylinders 204, 204' and 206, 206' include internal pistons and air inlet and outlet valves (schematically illustrated in FIG. 9) for introducing and ejecting pressurized air to drive the pistons into and out of the interior portion of the frame 200.

Cables 208 and 210 are coupled by connectors to the free ends of the pistons of the eject cylinder 204 and the insert cylinder 204', respectively. Similarly, cables 212 and 214 are coupled to the free ends of the pistons of the eject cylinder 206 and the insert cylinder 206', respectively. The insertion cables 210, 214 and ejection cables 208, 212, are routed by a system of pulleys extending downward in FIG. 3 alongside the vertical guide tracks 90 and 92 and eventually are wound around respective pulleys of the pairs of the chain and cable connecting blocks connected to the pivot chains extending around the pivot sprockets, as described above in connection with FIG. 6. In the case of the right-hand pair of cables 212, 214, they extend down and around the pair of side-by-side cable guide pulleys 168, 170 depicted in FIG. 6 and are wound around the pulleys of the chain and cable connecting blocks 162 and 164, respectively, attached to the ends of the pivot sprocket chain 160. The left-hand pair of cables 208,210 are similarly wound around guide pulleys 168' (not shown) and 170' and the pulleys of chain and cable connecting blocks 162' and 164' depicted generally in FIG. 3. This serves to interconnect the paired cables so that retraction of one cable by one cylinder, e.g. cable 208 by cylinder 204, will extend the paired cable, e.g. cable 210.

As also depicted generally in FIG. 3, the other ends of the right- and left-hand pairs of cables, 208, 210 and 212, 214, respectively, are wound around a further pair of side-by-side guide pulleys 172' and 172, respectively. The ends of the insertion and ejection cables of each pair are coupled together beneath the chamber opening 24. In FIG. 3, it may be seen that the ejection cables 208 and 212 are connected together by adjustable connectors 174 and 176 that are commonly connected by short cable 178. Insertion cables 210 and 214 are similarly connected together by a pair of adjustable connectors and short cable (hidden behind the illustrated cables and connectors).

Generally speaking, during the respective insertion and ejection cycles, the insertion and ejection air cylinders are operated to pull on the insertion or ejection cables and exert drag on the other cables. The cables being pulled on exert pulling force around the pivot chain pulleys on which they are wound and against their common connection. The pulling force draws the pulleys laterally apart while it is resisted by the cables wound around the pivot chain pulleys on the other end of the pivot chains so that tension is maintained.

The lateral pull exerted by the insertion and ejection cables causes the pivot chains 160, 160' to rotate the pivot arms 106, 108 in the same direction and at the same time. Forces are equalized between the fight and left sets of cables by the common connections. Such forces may arise from differing resistances encountered in inserting or ejecting the side-by-side tray and wall-/panel connectors.

The use of a pneumatic operating system and the cable system so described to apply the pulling and drag forces to the pivot chains also advantageously self-limits the forces applied by the ends of the pivot arms against the surfaces of the trays. If a tray resists movement for one reason or another, the resistance may override the applied lateral force generated by the pneumatic operating system depicted in FIG. 9. In FIG. 9, a source of compressed air, e.g. an on-board air compressor or a factory air supply line, is coupled through an air line filter 300 to first and second parallel pneumatic system lines which terminate in two sets of the pneumatic air cylinders, that is cylinders 204, 206 and 204', 206'. First and second air pressure regulators and gauges 302 and 304 and the flow control valves 306, 308, 310, and 312 regulate the air pressure in each parallel system and the air flow to each cylinder. Solenoid valves 314 and 316 direct air to and from the two sets of cylinders. Silencers 326 and 328 can be employed to reduce noise generated by the system.

The air pressure is set so as to provide enough force on the inserter/ejector pivot arms 104, 106 to safely insert and eject the tray connectors into the wall connectors as described above. However, if an obstruction is present, then the cylinders will not be completely filled or emptied and piston and rod motion will stall. Each cylinder 204, 204', 206 and 206' is provided with a sensor which detects the movement of the respective piston and rod into and out of the cylinder body. If motion is obstructed, then the sensors will not detect the completion of the motion, and an alarm signal may be generated to halt the cycle so that the operator can locate and remove the obstruction.

The first air pressure regulator 302 is adapted to maintain a substantially constant tension on the cables 208, 210, 212 and 214. The air pressure provided by this regulator 302 is desirably relatively low, e.g. on the order of about 20 p.s.i. This low pressure air in supplied to pistons 204 and 206 by shuttle valves 322 and 324, respectively.

The second air pressure regulator 304 in FIG. 9 provides the pressure necessary to actuate the air cylinders to insert or eject the trays during the insertion and ejection operations. Accordingly, the pressure delivered by the second regulator 304 is desirably significantly higher than that provided by the first regulator 302 so that it can overcome the tensioning force provided by the first regulator 302 to move the cylinders. A setting of about 50 p.s.i. on the second air pressure regulator 304 has been found to work well.

As noted above, pairs of cables associated with each rotor arm are connected to one another so that as one cable retracts, it forces the other to extend. Hence, the pairs of associated air cylinders, i.e., 204, 204' and 206, 206', are connected to one another through the cables. As illustrated in FIG. 9, all of the cylinders are desirably connected to the air pressure lines on the rod end only. The ports on the opposite end of the cylinders may be left open to vent as extension of the air cylinders will be accomplished by retraction of the other, paired, cylinder.

The insertion air cylinders 204' and 206' should have a stroke sufficient to ensure full insertion of the trays; in the embodiment shown, air cylinders having a six-inch stroke have been found to suffice. The ejection air cylinders 204 and 206 provide the cable force necessary to retract the trays during the ejection operation outlined above. These cylinders also are desirably designed to maintain tension on cables. Accordingly, it is desirable that these air cylinders 204, 206 have a stroke length longer than that necessary to move the arms 104, 106 to eject the trays. Providing cylinders 204, 206 with an eight-inch stroke but using only the middle six inches of that stroke for the ejection operation has been found to provide sufficient clearance on either end of travel to maintain the desired tension.

The flow controls 306, 308, 310 and 312 are desirably each connected to their respective cylinders in a manner which will permit unrestricted airflow through the flow control's check valve and to provide an adjustable restricted airflow.

In the position shown in FIG. 9, the arms 104 and 106 are oriented toward the interior of the oven, which is preferably their normal "home position." As shown in FIG. 9, in this home position the solenoid air valves 314, 316 are de-energized. In this position, high pressure can pass into air cylinders 204' and 206' with only the low pressure regulator 302 being connected to the other two air cylinders 204, 206 through shuttle valves 322 and 324, respectively.

When the solenoid valves 314, 316 are energized, high pressure air flows into flow controls 306 and 312. This high pressure through these controls opens shuttle valves 322 and 324, permitting high pressure air into the associated air cylinders 204 and 206. This flow of high ;pressure air from air pressure regulator 304 into the air cylinders 204 and 206, along with the termination of high pressure air supply to flow controls 308 and 310, causes the rod and pistons and air cylinders 204 and 206 to retract, which causes air cylinders 204' and 206' to extend due to their connection via the cables. The air cylinders of the present invention may thus be actuated to move the arms 104 and 106 by selectively controlling the solenoid air valves 314 and 316.

The operation of the apparatus thus described is controlled by the control system of FIG. 12 in accordance with the flow charts of FIGS. 13 and 14. FIG. 12 illustrates one embodiment of an electronic control system for controlling the insertion and ejection cycles of the invention. Many of the operative elements illustrated schematically in FIG. 12 are referenced with the same reference numbers outlined above and such elements relate to the electronic control of the like-numbered elements in FIGS. 1-11.

For instance, the control system includes a drive motor shaft mounted encoder disk rotation sensor 123 which emits a pulse with incremental rotation of the shaft of the motor 120, as detailed above in connection with FIG. 4. The pulse signals may be counted to derive the amount of vertical movement of the vertical drive chains 142, 144. Similarly, the trip sensor 240 of FIGS. 10 and 11 used to detect when a tray is out of position is shown in FIG. 12 and connected to a logic controller, as noted below.

An electronic control circuit for use with the invention desirably may be programmed to control the operations of the system in a fashion detailed more fully below. In the circuit shown schematically in FIG. 12, two programmable logic controllers (PLC's) are used. This circuit includes a primary PLC 402 and an expansion PLC 404 for expanding the capabilities of the primary PLC. A PLC manufactured by IDEC Corp. of San Jose, Calif., USA under part number FC1A-C1A1E has been found to work well for the primary PLC 402 of FIG. 12; IDEC also manufactures a companion expanion chassis PLC 404 for use with that model PLC.

The circuit of FIG. 12 also includes an independent power supply 418 to provide power to the circuit and drive the PLC's. Although the insertion and ejection operations may be controlled as single continuous operations, in the schematic of FIG. 12 the control of the insert and eject cycles is broken into four different zones (ZN 1–ZN 4 in FIG. 12). An insert/eject enablement switch 406 is optimally automatically controllable so that the insert and eject cycles can be initiated without any manual intervention from the operator. If so desired, the system may include a separate switch 420 for moving the system from a completely automated operation to a manually activated operation.

The other elements and functions of the circuit shown in FIG. 12 will be readily understood by those skilled in the art. Skilled artisans will also recognize that the embodiment of the electronic controller shown in FIG. 12 is merely one of many suitable configurations of controlling the system of the invention in accordance with the present teachings.

FIG. 13 illustrates the steps of a preferred embodiment of the insertion cycle and mode in a flow chart format. When an operator is ready to begin inserting a new batch of trays into the apparatus for testing, a start signal may be generated to initiate the insertion process, e.g. by manually entering a control code into an electronic control panel or the like. When the "start" signal is received, all sensor signal counters or count bins are reset and the pneumatic control system of FIG. 9 is enabled in the insertion mode.

Enabling the pneumatic system may be a purely mechanical operation, such as by mechanically opening a valve (300 in FIG. 9) or starting a compressor to connect the pneumatic system of FIG. 9 to a pressurized air supply. In a preferred embodiment using an electronic control system, though, it is preferred that the enablement of the pneumatic system be a combination of such a mechanical operation and an electronic sequence designed to initiate a control protocol for the insertion cycle.

Before the insertion process begins, it may be advisable to make sure that the door 28 of the oven is closed. If it is not open, the door may be automatically opened by enabling an electrical switch or the like, as shown in FIG. 13, or a signal informing the operator that the door is closed may be generated. If the door is open, the carriage 80 (or "bar" in FIG. 13) may be moved to its home position, i.e. a position below the bottom-most pair of trays 40n−1 and 40n, if it is not already there. The operator may then begin manually loading the trays into their respective slots so that they are ready for final insertion to complete the electrical connection to the oven.

Once the trays have all been manually loaded, a switch starting the insert cycle (e.g. switch 406 in FIG. 12) may be enabled (i.e. turned on) to begin the automated insertion process. In order to prevent damage to the apparatus, the trays or the components on the trays, it is advisable to make sure that there are no obstructions in the carriage's path. In accordance with the embodiment detailed above, a trip sensor 240 may generate a signal if the light beam 242 is interrupted. If the path of the light beam is clear, the insert cycle may be started. Although FIG. 13 only shows the trip sensor being checked at the beginning of the process, it is preferable that the insertion process be suspended if the trip sensor detects a break in the light beam at any time during the insertion or ejection operation.

Before the carriage begins to move, it may be desirable to rotate the arms 104, 106 into their forwardly-facing position away from the trays (e.g. toward the position illustrated as "B" in FIG. 6). A counter may then be set to one, denoting the first insertion position for inserting the first pair of trays.

The carriage may be moved to insertion position "i", i.e. the insertion position defined by the counter, by energizing the drive motor 120 to rotate the sprocket 130 in the clockwise direction to move the carriage 80 upward. As the carriage moves, the sensor 123 notes distance and, given a predetermined sensor count between the home position of the carriage and its first insert position, the carriage's vertical position can be determined as a function of sensor output pulse count. Once the carriage is in its first insert position the arms may be rotated rearwardly, i.e. toward the position designated "C" in FIG. 7, inserting the tray as explained above. The arms may be rotated outwardly, i.e. back out to their initial position, and the counter can be indexed by one, e.g. increasing "i" from one (for the first insertion position) to two (for the second indexing position).

The process outlined in the preceding paragraph can be continued until all of the pairs of trays $40_1$–$40_n$, have been inserted. As there are n trays in the oven and, in the embodiment outlined above, these trays are arranged in two parallel rows, there will be n/2 insertion positions for the carriage. Hence, when the counter is indexed by one to indicate that the carriage should be moved to the last insertion position, the counter will have a value of n/2. When this last insertion is completed, the counter value will exceed n/2.

Accordingly, a counter value of greater than n/2 can be used to indicate that insertion has been completed and the carriage may then be moved downwardly into its home position beneath the carriages first insertion position and the arms may be rotated in to complete the last step of the insertion cycle. Although not shown in the schematic of FIG. 13, if so desired the system can generate a signal to automatically close the door and initiate the testing of the components in the oven. Alternatively, an operator can manually check to make sure that the trays have all been successfully inserted before closing the door and initiating the testing protocol.

In the ejection cycle, the steps of the flow chart of FIG. 14 are followed. When a component testing run of the oven has been completed and the trays are ready to be unloaded, the ejection sequence may be started. This may either be initiated manually by an operator entering a command in the control system or automatically as a step in the testing protocol. If the test protocol involves elevated temperatures, it may be desirable to allow a suitable period of time after the testing is completed to permit the trays and their associated components to cool down before initiating the ejection sequence outlined in FIG. 14.

Once the ejection sequence is started, all sensor signal counters or count bins are reset and the pneumatic control system of FIG. 9 is enabled in the ejection mode. The position of the door may be checked to make sure that it is open before proceeding with ejection. As in the insertion operation, the carriage may then be moved to its home position, i.e. its lowermost position, if it is not already in that position. The trip sensor outlined above may also be used to ensure that no obstructions are in the path of the carriage before it is moved either upwardly or downwardly. This set of operations is much the same as those outlined above in connection with the insertion sequence schematically illustrated in FIG. 13.

If there are no obstructions detected by the trip sensor, the eject cycle may begin, such as by setting switch 406 in FIG. 12 to its "eject" position. If so desired, the arms may be rotated out, i.e. away from the trays, to ensure good clearance between the trays and the arms when the carriage moves. A counter, which may be the same counter used in the insertion cycle detailed above, is then set to its maximum position. As explained previously, in the embodiment shown, this position will be n/2.

The carriage may then be moved upwardly to ejection position "i−½". As defined herein, this position is between ejection position "i", i.e the ejection position of the carriage defined by the counter, and ejection position "i−1", i.e the ejection position below position i. As the ejection positions generally correspond to the vertical positions of the generally horizontal pairs of trays, this will ensure that the arms are between two such rows. (The insertion and ejection positions of the carriage may be substantially the same, e.g. such that insertion position "i" and ejection position "i" are the same vertical position of the carriage.)

When the carriage is in place, the arms may be rotated inwardly, i.e toward the trays, about their pivot points. Positioning the carriage at ejection position "i−½" permits the arms to rotate inwardly between two rows of trays so that the wheels 116, 118 at the ends of the arms can be positioned beneath the trays at position "i" without striking the forward edge of the bar 68.

Once the arms have been rotated inwardly beneath the trays, the carriage may be moved up to eject position "i" to position the arms rearwardly of the rear surface 74 of the bar. The arms may then be rotated outwardly, i.e. forwardly toward the position designated "B" in FIG. 6. The wheels will bear against the rear surface of the bar, urging the trays out of engagement with the rear wall mounted connectors 60 of the oven. The counter may then be decreased by one to indicate that the carriage should be moved into position to eject the next lower pair of trays.

This process may be repeated for each ejection position until all of the pairs of trays have been ejected. Since the lowermost ejection position is the first position of the carriage, i.e. "i" = 1, when the last pair of trays has been ejected and the counter is decreased by one, the counter will be set at 0. As all of the trays have been ejected when the trays at ejection position 1 have been ejected, the ejection mechanism has completed its task when the counter is less than one, as illustrated in FIG. 14.

When ejection has been completed, the carriage is moved back to its home position and the arms may be rotated inwardly. The trays may then be manually unloaded from the oven by an operator. Since the apparatus of the invention has already ejected the trays a sufficient distance to ensure that the trays have been disconnected from the rear wall connectors $60_1$–$60_n$, unloading the trays should be much easier than if the operator had to break this connection.

In both the insertion cycle outlined in FIG. 13 and the ejection cycle illustrated in FIG. 14, the bar is moved into its home position. As also denoted in FIGS. 13 and 14, the carriage must be moved to a series of insertion or ejection positions during the respective cycles. An interlock may be provided to prevent operation of the insertion/ejection apparatus unless the carriage is properly positioned at the start of the respective cycle or at any point during the insertion or ejection cycles. Although FIGS. 13 and 14 indicate that the pivot arms 104 and 106 are rotated in at the end of the outlined cycle, the arms may be locked in a position generally parallel with the body of the carriage 80 to keep them out of the way of both the door and the trays when the carriage is not being used.

If an out-of-position tray is sensed by the interruption of the light beam as described above with reference to FIGS. 10–12 at any time during operation, a further interrupt routine may halt the drive motor 120 until the obstructing tray is repositioned. All counter counts remain fixed during the interruption, and the steps of the flow charts resume thereafter. The electronic control system may be provided with a reset command entered by the operator to commence the resumption.

Although the preferred embodiments employ the pivoting arm and pneumatically controlled cable system to push in and pull out the trays, it will be understood that other mechanisms may be substituted without departing from the spirit of the invention. For example, rack and pinion mounted rams may be substituted for the pivot arms and electrical motors and control switches may be substituted for the pneumatic control system and the cable drive system. Similarly, other carriage drive mechanisms may be substituted for the chain drive transmission. Variations in the steps of operation in the insertion and ejection cycles may also be made within the spirit and scope of the invention.

Accordingly, many variations, modifications and substitutions of equivalent structures, steps and elements for those described in regard to the preferred embodiment of the invention may become apparent to those skilled in the art. The invention having been so described will be thus understood to encompass such equivalent structures, steps and elements within the spirit and scope of the invention defined by the appended claims.

What is claimed is:

1. An apparatus for connecting and disconnecting electrical connectors of electronic component test trays to and from electrical connectors in a panel of an environmental test chamber at the beginning and end of a test period to insert and eject the test trays comprising:
    a plurality of test trays having a test tray electrical connector and receptacles for receiving electronic components subjected to environmental testing and making connections with test tray conductors which terminate at terminals of each test tray connector;
    a closed environment test chamber having an access door through which test trays may be inserted or removed from the chamber when open, the test chamber including a plurality of lateral tray supports for slidably receiving and supporting the test trays and aligning the test tray connectors with a plurality of mating electrical connectors arrayed in alignment therewith mounted within the test chamber; and
    tray insertion and ejection means operable in an insertion and an ejection cycle for automating the connection and separation of the tray and chamber mounted connectors, further comprising:
        insertion cycle controlling means for sequentially operating the insertion means to sequentially move each tray on its tray support in an insertion direction to connect the tray connector to its mating chamber mounted connector until all trays are inserted and connected; and
        ejection cycle controlling means for sequentially operating the ejection means to sequentially move each tray on its tray support in an ejection direction to disconnect the tray connector from its mating chamber mounted connector until all trays are ejected and disconnected.

2. The apparatus of claim 1 wherein the insertion and ejection means further comprises:
    means for moving the insertion and ejection means in an insertion and an ejection direction during the insertion and ejection cycles between insertion and ejection positions with respect to each tray; and
    control means for operating the moving means in the insertion and ejection cycles.

3. The apparatus of claim 1 further comprising:
    a tray out of position trip sensor for detecting any out of position trays that would interfere with the insertion and ejection means during movement between insertion and ejection positions and for halting such movement.

4. The apparatus of claim 1 wherein:
    the trays further comprise first and second opposed end surfaces formed on the end of the tray opposite to the tray connector end for engaging with the insertion and ejection means, whereby the insertion means bears against the first end surface during insertion movement and the ejection means bears against the second end surface during ejection movement.

5. The apparatus of claim 1 wherein:
    said ejection cycle controlling means further comprises means operable in sequence in the ejection cycle to effect movement of said ejection means to a first tray ejection position with respect to each tray to be ejected, to extend the ejection means to an extended position extending alongside the tray to be ejected, to effect further movement of the insertion and ejection means to a second tray ejection position, to retract the ejection means into engagement with the second end surface, and to return the ejection means to a starting position, whereby the tray and chamber mounted connectors are disconnected.

6. The apparatus of claim 5 wherein:
    said insertion cycle controlling means further comprises means operable in sequence in the insertion cycle to effect movement of said insertion means to a tray insertion position with respect to each tray to be inserted, to extend the insertion means toward the tray to be inserted and into engagement with the first end surface to effect movement of the tray during extension of the insertion means, and to retract the insertion means to a starting position, whereby the tray and chamber mounted connectors are connected.

7. The apparatus of claim 1 wherein:
    said insertion cycle controlling means further comprises means operable in sequence in the insertion cycle to effect movement of said insertion means to a tray insertion position with respect to each tray to be inserted, to extend the insertion means toward the tray to be inserted and into engagement with the first end surface to effect movement of the tray during extension of the insertion means, and to retract the insertion means to a starting position, whereby the tray and chamber mounted connectors are connected.

8. An apparatus for inserting and ejecting electrical connectors of electronic component test trays from electrical connectors in a panel of an environmental test chamber at the beginning and end of a test period to facilitate loading and unloading the test trays comprising:
    a plurality of test trays having a test tray electrical connector and receptacles for receiving electronic components subjected to environmental testing and making connections with test tray conductors which terminate at terminals of each test tray connector;

a closed environment test chamber having an access door through which test trays may be inserted or removed from the chamber, the test chamber including a plurality of lateral tray supports for slidably receiving and supporting the test trays and aligning the test tray connectors with a plurality of mating electrical connectors arrayed in alignment therewith mounted within the test chamber; and tray insertion and ejection means including a track guided, carriage mounted, inserter/ejector mechanism operable in an insertion and an ejection cycle for automating the connection and separation of the tray and chamber mounted connectors, further comprising:

insertion cycle controlling means for sequentially advancing the carriage along the track from tray to tray and operating the inserter mechanism to sequentially move each tray on its tray support in an insertion direction to insert the tray connector into its mating chamber mounted connector until all trays are inserted and connected; and ejection cycle controlling means for sequentially advancing the carriage along the track from tray to tray and operating the ejection mechanism to sequentially move each tray on its tray support in an ejection direction to eject the tray connector from its mating chamber mounted connector until all trays are ejected and disconnected.

9. The apparatus of claim 8 wherein the insertion and ejection means further comprises:

a motor and drive train controlled by the insertion and ejection cycle controlling means for moving the carriage for the inserter/ejector mechanism in an insertion and an ejection direction during the insertion and ejection cycles between insertion and ejection positions with respect to each tray.

10. The apparatus of claim 9 wherein the inserter/injector mechanism further comprises:

at least one pivot arm having a pivot point and a free end;

means for mounting the pivot arm pivot on said carriage means for allowing pivotal movement of the free end thereof from a pivot rest position through a pivot arc; and wherein:

said insertion cycle controlling means further comprises first means for moving the pivot arm through an insertion pivotal movement about its pivot to apply its free end against a tray to move the tray on the lateral tray supports a constant distance, so that the tray connector is connected with the chamber mounted connector; and said ejection cycle controlling means further comprises second means for moving the pivot arm through an ejection pivotal movement about its pivot to apply its free end in contact with the tray to move the tray on the lateral tray supports a constant distance, so that the tray connector is disconnected from the chamber mounted connector.

11. The apparatus of claim 8 wherein the inserter/injector mechanism further comprises:

at least one pivot arm having a pivot point and a free end;

means for mounting the pivot arm pivot on said carriage means for allowing pivotal movement of the free end thereof from a pivot rest position through a pivot arc; and wherein:

said insertion cycle controlling means further comprises first means for moving the pivot arm through an insertion pivotal movement about its pivot to apply its free end against a tray to move the tray on the lateral tray supports a constant distance, so that the tray connector is connected with the chamber mounted connector; and said ejection cycle controlling means further comprises second means for moving the pivot arm through an ejection pivotal movement about its pivot to apply its free end in contact with the tray to move the tray on the lateral tray supports a constant distance, so that the tray connector is disconnected from the chamber mounted connector.

12. The apparatus of claim 11 wherein:

the trays further comprise first and second opposed end surfaces formed on the end of the tray opposite to the connector end for engaging with the free end of the pivot arm during operation of the first pivot arm moving means and the second pivot arm moving means, respectively, whereby the free end of the pivot arm bears against the first end surface during pivotal movement of the arm away from the carriage and bears against the second end surface during pivotal movement of the arm toward the carriage.

13. The apparatus of claim 12 wherein:

said ejection cycle controlling means further comprises means operable in sequence in the ejection cycle to effect movement of said carriage to a first tray ejection position with respect to each tray to be ejected, to pivot the pivot arm to an extended position extending alongside the tray to be ejected, to effect movement of the carriage to a second tray ejection position, to pivot the free end of the pivot arm toward the carriage and into engagement with the second end surface, and to return the pivot arm to the rest position, whereby the tray is moved toward the carriage and the tray and chamber mounted connectors are disconnected.

14. The apparatus of claim 13 wherein:

said insertion cycle controlling means further comprises means operable in sequence in the insertion cycle to effect movement of said carriage to a tray insertion position with respect to each tray to be inserted, to pivot the free end of the pivot arm through an arc extending toward the tray to be inserted and into engagement with the first end surface to effect movement of the tray away from the carriage, and to return the pivot arm to the rest position, whereby the tray and chamber mounted connectors are connected.

15. The apparatus of claim 14 further comprising:

a tray position trip sensor mounted on the carriage for detecting any out of position trays that would interfere with and be damaged by the carriage as the carriage traverses the ends of the trays and for providing a trip signal; and means responsive to a trip signal for halting the operation of the motor and drive train until the trip sensor is reset and the out of position tray is repositioned.

16. The apparatus of claim 12 wherein:

said insertion cycle controlling means further comprises means operable in sequence in the insertion cycle to effect movement of said carriage to a tray insertion position with respect to each tray to be inserted, to pivot the free end of the pivot arm through an arc extending toward the tray to be inserted and into engagement with the first end surface to effect movement of the tray away from the carriage, and to return the pivot arm to the rest position, whereby the tray and chamber mounted connectors are connected.

17. The apparatus of claim 8 further comprising:

a tray position trip sensor mounted on the carriage for detecting any out of position trays that would interfere with and be damaged by the carriage as the carriage traverses the ends of the trays and for providing a trip signal; and means responsive to a trip signal for halting the operation of the motor and drive train until the trip sensor is reset and the out of position tray is repositioned.

* * * * *